(12) United States Patent
Shoji

(10) Patent No.: US 7,646,196 B2
(45) Date of Patent: Jan. 12, 2010

(54) CURRENT SENSOR AND METHOD OF MANUFACTURING CURRENT SENSOR

(75) Inventor: Shigeru Shoji, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 12/213,352

(22) Filed: Jun. 18, 2008

(65) Prior Publication Data
US 2008/0316655 A1 Dec. 25, 2008

(30) Foreign Application Priority Data
Jun. 25, 2007 (JP) ............................. 2007-166576

(51) Int. Cl.
*G01R 33/09* (2006.01)
*G01R 33/05* (2006.01)

(52) U.S. Cl. ........................................ 324/252; 324/249

(58) Field of Classification Search ............ 324/207.21, 324/249, 252; 257/421–427; 365/158; 438/3; 428/811, 811.2, 811.3, 811.5, 812, 826–827; 360/313–316, 324–327
See application file for complete search history.

(56) References Cited

U.S. PATENT DOCUMENTS 4,749,939 A 6/1988 Seitz
6,064,552 A * 5/2000 Iwasaki et al. .............. 360/322

FOREIGN PATENT DOCUMENTS

JP B2-7-123090 12/1995

* cited by examiner

*Primary Examiner*—Bot L LeDynh
(74) *Attorney, Agent, or Firm*—Oliff & Berridge, PLC

(57) ABSTRACT

Provided is a current sensor capable of detecting an induced magnetic field by a current to be detected with higher precision. The first and second modules are provided on facing surfaces of integrated substrates, respectively, with spacers in between. Each of the first and second modules includes an element substrate, and an MR element layer. On each of the MR elements layers, provided is an MR element having a stacked structure including a pinned layer, a nonmagnetic intermediate layer, and a free layer whose magnetization direction changes according to the induced magnetic field and which exhibits an anisotropic field in a direction different from that of the magnetization of the pinned layer. The stacked structures of the MR elements are provided in a same layer level.

28 Claims, 17 Drawing Sheets

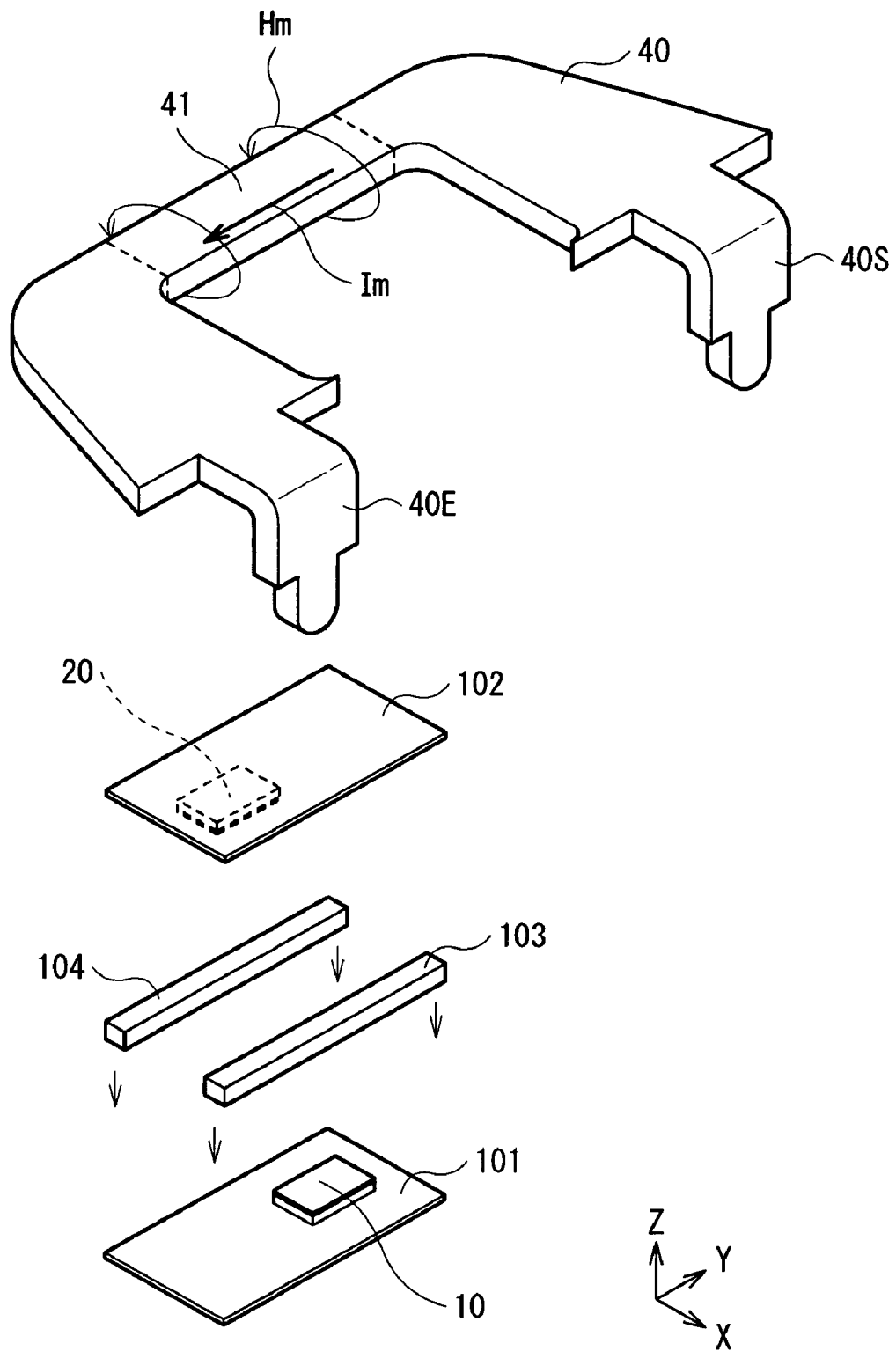
F I G. 2

CURRENT SENSOR AND METHOD OF MANUFACTURING CURRENT SENSOR

CROSS REFERENCES TO RELATED APPLICATIONS

The present invention contains subject matter related to Japanese Patent Application JP 2007-166576 filed in the Japanese Patent Office on Jun. 25, 2007, the entire contents of which being incorporated herein by reference.

BACKGROUND OF THE INVENTION

1. Field of the Invention

The present invention is related to a current sensor capable of detecting a change of a current flowing through a conductor with high precision, and a method of manufacturing such a current sensor.

2. Description of the Related Art

Generally, for an accurate measurement of a control current flowing through a circuit of a control device, there is used a method where a resistance is connected in series to a circuit so as to measure a voltage drop of the resistance. However, in this case, a load other than a lord of the control system is added, and thus the control system may be adversely influenced in some way. For this reason, there is used a method where a gradient of a current magnetic field generated by the control current is detected, and thereby the control current is indirectly measured. Specifically, the control current is supplied to a curved conductor having a U shape, and a change of the current magnetic field generated in the periphery of the curved conductor is detected by a hall element (for example, refer to Japanese Examined Patent publication No. Hei-7-123090).

However, in such a current sensor, miniaturization is difficult. Also an issue has been pointed out that the detection sensitivity with respect to the change of the magnetic field is insufficient in terms of a linearity and a high frequency response. Thus, a current sensor has been proposed where, instead of the hall element, a giant magnetoresistive element (hereinafter, referred to as a GMR element) exhibiting a giant magnetoresistive effect is arranged in the current magnetic field by the control current so as to detect the gradient of the current magnetic field. In the current sensor using such a GMR element, the detection sensitivity and the response characteristics are improved, and stable detection characteristics may be obtained, even if there is a temperature variation.

SUMMARY OF THE INVENTION

In recent years, a magnetic sensor and a current sensor capable of detecting even a weak magnetic flux or current, and having more compact configurations are highly preferable. However, with the miniaturization, even the magnetic sensor and the current sensor using GMR elements are likely influenced by noise from external (unnecessary magnetic field, or the like), and thus an improvement in stability of the detection sensitivity and the responsiveness becomes an issue. Although several approaches have been attempted including that the GMR elements are formed in the shape of strips so that the shape anisotropy is enhanced, it is difficult to say that they have sufficiently reached the stable performance level.

In the view of foregoing, it is preferable to provide a current sensor capable of detecting an induced magnetic field by a current to be detected with higher precision. Also, it is further preferable to provide a method of efficiently manufacturing such a current sensor.

A first current sensor of the present invention is disposed in a vicinity of a conductor generating an induced magnetic field by a current to be detected which is supplied to the conductor, and detects the current to be detected. The first current sensor includes a first magnetoresistive element and a second magnetoresistive element, each of the first and the second magnetoresistive elements having a stacked structure including a pinned layer whose magnetization direction is pinned in a predetermined direction, a nonmagnetic intermediate layer, and a free layer whose magnetization direction changes according to the induced magnetic field, the free layer exhibiting an anisotropic field in a direction different from the magnetization direction of the pinned layer. Here, the first and the second magnetoresistive elements are configured so that the stacked structures in the first and the second magnetoresistive elements are in a same layer level along stack surfaces of the stacked structures, and a resistance value of the first magnetoresistive element and the resistance value of the second magnetoresistive element change in directions opposite to each other according to the induced magnetic field. The term "anisotropic field" as used in the present invention means all anisotropic fields caused by a crystal structure or shape. Also, the expression "opposite direction" as used in the present invention means that a direction of increase of the resistance value and a direction of decrease of the resistance value are opposite to each other. That is, the relationship is established that the resistance value of the second magnetoresistive element is lowered as the resistance value of the first magnetoresistive element is increased, and the resistance value of the second magnetoresistive element is increased as the resistance value of the first magnetoresistive element is lowered.

A second current sensor of the present invention is disposed in a vicinity of a conductor which generates an induced magnetic field by a current to be detected which is supplied to the conductor, and detects the current to be detected. The second current sensor includes a first to a fourth magnetoresistive elements, each of the first to the fourth magnetoresistive elements having a stacked structure including a pinned layer whose magnetization direction is pinned in a predetermined direction, a nonmagnetic intermediate layer, and a free layer whose magnetization direction changes according to the induced magnetic field and exhibiting an anisotropic field in a direction different from the magnetization direction of the pinned layer. Here, the first to the fourth magnetoresistive elements are configured so that the stacked structures of the first to the fourth magnetoresistive elements are in a same layer level along the stack surfaces of the stacked structures, and a resistance value of the first magnetoresistive element and the resistance value of the third magnetoresistive element change in the same direction according to the induced magnetic field, and the resistance values of the second and the fourth magnetoresistive elements change in a direction opposite from change direction of the resistance values of the first and the third magnetoresistive elements according to the induced magnetic field.

In the first and the second current sensors in the present invention, the stacked structures of the first and the second (or the first to the fourth) magnetoresistive elements are provided in a same layer level. Specifically, in a thickness direction of the stacked structures, one surface of the stacked structure of the first magnetoresistive element, and the one surface of the stacked structure of the second magnetoresistive element completely correspond to each other, and the other surface of the stacked structure of the first magnetoresistive element, and the other surface of the stacked structure of the second magnetoresistive element completely correspond to each other. Or a part of the stacked structure of the first magnetoresistive element and a part of the stacked structure of the second magnetoresistive element are located in the same height level to each other. That is, a positional relationship is established that when one of the stacked structures is shifted in parallel in the direction orthogonal to the thickness direction (shifted in parallel to the stack surfaces), at least one of the stacked structures partially overlaps with the other of the stacked structures. By such a configuration, it becomes relatively easy that the stacked structures of the first and the second magnetoresistive elements are disposed with equal distance away to the conductor to which the current to be detected is supplied. As a result, when the current to be detected is supplied to the conductor, the difference of the induced magnetic field imparted to each of the stacked structures becomes small in comparison with the case where the stacked structures are located in different layer levels to each other.

In the first current sensor of the present invention, both of the free layers in the first and the second magnetoresistive elements are preferably located in the same layer level. Similarly, in the second current sensor of the present invention, all of the free layers in the first to the fourth magnetoresistive elements are preferably located in the same layer level.

In the first current sensor of the present invention, it is preferable that the stacked structure of the first magnetoresistive element and the stacked structure of the second magnetoresistive element are in such a relationship that the first and the second magnetoresistive elements come coincident with each other when performing a rotational operation around a central axis of rotation parallel to stack surfaces of the stacked structure or performing both of the rotational operation and a parallel shift operation. Specifically, when the stacked structure of the first magnetoresistive element rotates 180° (including a certain error such as a manufacturing error) around the central axis, the stacked structure of the first magnetoresistive element is in the relationship equivalent to the stacked structure of the second magnetoresistive element. Here, the expression "equivalent relationship" means the relationship that one overlaps with (corresponds to) the other as they are, or one overlaps with the other when one is shifted in parallel. If such a configuration is held, in each of the first and the second magnetoresistive elements, the relative angle between the direction of the anisotropic field of the free layer, and the magnetization direction of the pinned layer becomes equal to each other. That is, in an initial state, the relative angle between the magnetization direction of the free layer, and the magnetization direction of the pinned layer becomes equal to each other. Here, the expression "initial state" means the state that no external magnetic field including the induced magnetic field generated from the conductor is imparted to the first and the second magnetoresistive elements. For example, a bias magnetic field (in other words, a refresh magnetic field) having a magnitude equal to or larger than that of the magnetic field where the magnetization of the free layer is saturated is applied to both of the first and the second magnetoresistive elements along the central axis, and thereby the initial state may be obtained.

In the second current sensor of the present invention, it is preferable that the stacked structure of the first magnetoresistive element and the stacked structure of the third magnetoresistive element have the equivalent relationship to each other, and the stacked structure of the second magnetoresistive element and the stacked structure of the fourth magnetoresistive element have the equivalent relationship to each other. Also, it is preferable that the stacked structures of the first and the third magnetoresistive elements, and the stacked structures of the second and the fourth magnetoresistive elements are in such a relationship that the first and the third magnetoresistive elements, and the second and the fourth magnetoresistive elements come coincident with each other when performing a rotational operation around a central axis of rotation parallel to stack surfaces of the stacked structure or performing both of the rotational operation and a parallel shift operation. Here, the expression "equivalent relationship" means the relationship having the structure that one overlaps with (corresponds to) the other when one is shifted in parallel. Here, the expression "structure" is a concept including the magnitude and the magnetization direction. If such a configuration is held, in each of the first to the fourth magnetoresistive elements, the relative angle between the direction of the anisotropic field of the free layer, and the magnetization direction of the pinned layer becomes equal to each other. That is, in the initial state, the relative angle between the magnetization direction of the free layer and the magnetization direction of the pinned layer becomes equal to each other.

In the first and the second current sensors of the present invention, a bias magnetic field applying means (refresh magnetic field) is provided. Thus, when the bias magnetic field (refresh magnetic field) where the bias magnetic field applying means is generated is temporarily imparted so that the free layer of each of the magnetoresistive elements is saturated, the magnetization direction of the free layer is aligned in a predetermined direction, even in the case that the magnetization direction of the free layer is disturbed by unnecessary magnetic field (disturbance magnetic field). Especially, when the anisotropic field of the free layer in each of the magnetoresistive elements correspond to each other, and the bias magnetic field applying means is arranged so that the bias magnetic field (refresh magnetic field) is generated along the direction (the direction of the anisotropic field of the free layer), the direction of the anisotropic field of the free layer is stabled, and thus the output of the magnetoresistive elements is stabled at a high level. In the case that there is almost no influence of the disturbance magnetic field, and the direction of the anisotropic field of the free layer is sufficiently stabled, the bias magnetic field may be unnecessary to be imparted.

The first and the second current sensors of the present invention further include a support member supporting the first and the second (or the first to the fourth) magnetoresistive elements. The support member has a reference plane facing outward, the reference plane being located in parallel to the stack surfaces in the stacked structures of the first and the second magnetoresistive elements. If such a configuration is held, when the first current sensor of the present invention is disposed in the vicinity of the conductor so that the reference plane becomes parallel to the direction of the flow of the current to be sensed, the stacked structures of the first and the second (or the first to the fourth) magnetoresistive elements are located with the equal distances away to the conductor.

The first current sensor of the present invention includes a first constant current source and a second constant current source supplying constant currents of equal values to the first and the second magnetoresistive elements, respectively, and a differential detector detecting a difference of voltage drops generated, by the constant currents, in the first and the second magnetoresistive elements, respectively. Thereby, the current to be detected is detected on the basis of the difference of the voltage drops. In that case, a compensation current line is further and preferably provided which generates a compensation magnetic field by a compensation current flowing according to the difference of the voltage drops, and applies the compensation magnetic field to the first and the second magnetoresistive elements, the compensation magnetic field directing in a direction opposite from that of the induced magnetic field applied to the first and the second magnetoresistive elements according to the current to be detected. This is because, the variation of characteristics between the first magnetoresistive element and the second magnetoresistive element, the variation of the connection resistance in the circuit, and the error caused by the temperature distribution are suppressed.

In the second current sensor of the present invention, a bridge circuit as in the following is preferably provided. That is, one end of the first magnetoresistive element and one end of the second magnetoresistive element are connected at a first connection point, and one end of the third magnetoresistive element and one end of the fourth magnetoresistive element are connected at a second connection point. Also, the other end of the first magnetoresistive element and the other end of the third magnetoresistive element are connected at a third connection point, and the other end of the second magnetoresistive element and the other end of the fourth magnetoresistive element are connected at a fourth connection point. This is because, the current to be detected is detected on the basis of a potential difference between the third connection point and the fourth connection point, the potential difference generated when a voltage is applied between the first connection point and the second connection point. Further, a compensation current line is provided which generates a compensation magnetic field by a compensation current flowing according to a potential difference between the third connection point and the fourth connection point. The potential difference is generated when the voltage is applied between the first connection point and the second connection point, and then the compensation magnetic field is applied to the first to the fourth magnetoresistive elements, the compensation magnetic field directing in a direction opposite from that of the induced magnetic field applied to the first to the fourth magnetoresistive elements according to the current to be detected. This is because, the variation of characteristics between the first to the fourth magnetoresistive elements, the variation of the connection resistance in the circuit, and the error caused by the temperature distribution are suppressed.

According to a method of manufacturing a first current sensor of the present invention, provided is a method of manufacturing a current sensor disposed in the vicinity of a conductor generating an induced magnetic field by a current to be detected which is supplied to the conductor, and detecting the current to be detected. The method of manufacturing the first current sensor includes steps (A1) to (A4) in the following.

(A1) A step of integrating a plurality of magnetoresistive elements on a first substrate, each of the magnetoresistive elements including a stacked structure configured by stacking in this order a first ferromagnetic layer which exhibits an anisotropic field in a predetermined direction, and whose magnetization direction changes according to the induced magnetic field, a nonmagnetic intermediate layer, and a second ferromagnetic layer having a coercive force larger than that of the first ferromagnetic layer.

(A2) A step of collectively setting the magnetization directions of the second ferromagnetic layers in all of the plurality of magnetoresistive elements, into a direction different from that of the anisotropic field.

(A3) A step of taking out a first and a second element substrates each including one magnetoresistive element, by dividing a substrate into a plurality of pieces.

(A4) A step of disposing the first and the second element substrates so that the stacked structures of the magnetoresistive elements are located in the same layer level along the stack surfaces of the stacked structures, and a resistance value of the magnetoresistive element on the first element substrate and the resistance value of the magnetoresistive element on the second element substrate change in directions opposite to each other according to the induced magnetic field.

According to a method of manufacturing a second current sensor of the present invention, provided is a method of manufacturing a current sensor disposed in a vicinity of a conductor which generates an induced magnetic field by a current to be detected which is supplied to the conductor, and detecting the current to be detected. The method of manufacturing the second current sensor includes steps (B1) to (B4) in the following.

(B1) A step of integrating a plurality of magnetoresistive elements on a first substrate, each of the magnetoresistive elements including a stacked structure configured by stacking in this order a first ferromagnetic layer which exhibits an anisotropic field in a predetermined direction, and whose magnetization direction changes according to the induced magnetic field, a nonmagnetic intermediate layer, and a second ferromagnetic layer having a coercive force larger than that of the first ferromagnetic layer.

(B2) A step of collectively setting the magnetization directions of the second ferromagnetic layers in all of the plurality of magnetoresistive elements, into a direction different from that of the anisotropic fields.

(B3) A step of forming a first and a second element modules each including two magnetoresistive elements, by dividing a substrate into a plurality of pieces.

(B4) A step of disposing the first and the second element modules so that the stacked structures of the four magnetoresistive elements in the first and second element modules are located in the same layer level along the stack surfaces of the stacked structures, and a resistance values of the magnetoresistive elements on the first element module and resistance values of the magnetoresistive elements on the second element module change in directions opposite to each other according to the induced magnetic field.

In the method of manufacturing the first current sensor or the second current sensor of the present invention, the stacked structures of the first and the second element substrates (or the first and the second element modules) are disposed in the same layer level, and thereby the current sensor may be obtained in which the stacked structures are disposed with relative ease in positions with equal distances away to the conductor to which the current to be detected is supplied. In the current sensor obtained in this way, when the current to be detected is supplied to the conductor, the difference of the induced magnetic field imparted to each of the staked structures becomes small in comparison with the case of the current sensor having stacked structures which are disposed in the different layer levels to each other.

In the method of manufacturing the first current sensor of the present invention, the first and the second element substrates are preferably disposed so that the first ferromagnetic layers of both of the first and the second element substrates are located in the same layer level. Similarly, in the method of manufacturing the second sensor of the present invention, the first and the second element modules are preferably disposed so that the first ferromagnetic layers of both of the first and the second element modules are located in the same layer level.

In the method of manufacturing the first current sensor of the present invention, the first and the second element substrates are preferably disposed so that the stacked structure of the first element substrate and the stacked structure of the second element substrate are in such a relationship that the first and the second element substrates come coincident with each other when performing a rotational operation around a central axis of rotation parallel to stack surfaces of the stacked structure or performing both of the rotational operation and a parallel shift operation. This is because, thereby, in each of the magnetoresistive element of the first element substrate and the magnetoresistive element of the second element substrate, an error of the relative angle between the magnetization direction of the pinned layer and the direction of the anisotropic field of the free layer becomes relatively small. That is, in the initial state, the relative angle between the magnetization direction of the free layer and the magnetization direction of the pinned layer becomes equal to each other.

In the method of manufacturing the second current sensor of the present invention, the first and the second element modules are preferably disposed so that the stacked structure of the first element module and the stacked structure of the second element module are in such a relationship that the first and the second element modules come coincident with each other when performing a rotational operation around a central axis of rotation parallel to stack surfaces of the stacked structure or performing both of the rotational operation and a parallel shift operation. Thereby, in each of the four magnetoresistive elements, an error of the relative angle between the magnetization direction of the pinned layer and the direction of the anisotropic field of the free layer becomes relatively small. That is, in the initial state, the relative angle between the magnetization direction of the free layer and the magnetization direction of the pinned layer becomes equal to each other.

According to the first and the second current sensors of the present invention, the stacked structures of the first and the second magnetoresistive elements (or the first to the fourth magnetoresistive elements) are provided in the same layer level. Thus, when the current sensor is disposed in the vicinity of the conductor generating the induced magnetic field by the supply of the current to be detected, and detects the current to be detected, an error of the induced magnetic field affecting each of the stacked structures may be suppressed in comparison with the case where the stacked structures are located in the different layer levels to each other. Thereby, even if the current to be detected is weak, the measurement may be performed with the high precision. Especially, when the free layers of the first and the second magnetoresistive elements (or the first to the fourth magnetoresistive elements) are located in the same layer level, the measurement may be performed with the higher precision. Also, in the second current sensor, the first to the fourth magnetoresistive elements are disposed with equal distances away to the central axis located in parallel to the stack surfaces of the stacked structures of the first to the fourth magnetoresistive elements so that more homogeneous induced magnetic field may be imparted to the first to the fourth magnetoresistive elements. Thereby, the measurement may be performed with the higher precision.

Further, the stacked structure of the first magnetoresistive element and the stacked structure of the second magnetoresistive elements are in such a relationship that the first and the second magnetoresistive elements come coincident with each other when performing a rotational operation around a central axis of rotation parallel to stack surfaces of the stacked structure or performing both of the rotational operation and a parallel shift operation. Or the stacked structure of the first magnetoresistive element and the stacked structure of the third magnetoresistive element have the equivalent relationship to each other, and the stacked structure of the second magnetoresistive element and the stacked structure of the fourth magnetoresistive element have the equivalent relationship to each other. Also, the stacked structures of the second and the fourth magnetoresistive elements and the stacked structures of the first and the third magnetoresistive elements are in such a relationship that the second and the fourth magnetoresistive elements, and the first and the third magnetoresistive elements come coincident with each other when performing a rotational operation around a central axis of rotation parallel to stack surfaces of the stacked structure or performing both of the rotational operation and a parallel shift operation. In this case, the offset output caused by the difference between the resistances of the second and the fourth magnetoresistive elements, and the first and the third magnetoresistive elements may be suppressed in the initial state. Thereby, the output according to a magnetic field to be detected may be detected with the higher precision.

Further, when the support member supporting the first and the second magnetoresistive elements (or the first to the fourth magnetoresistive elements) is provided, the support member has the reference plane facing outward, the reference plane being located in parallel to the stack surfaces of the stacked structures of the first and the second magnetoresistive elements (or the first to the fourth magnetoresistive elements), and, the relative position of the conductor and each of the first and the second current sensors of the present invention may more be easily and precisely defined. Thereby, the detection of the current to be detected may be simply performed.

Also, according to the method of manufacturing the first and the second current sensors of the present invention, the current sensor having a detection performance of the high precision as described above may be efficiently manufactured.

According to the first and the second current sensors of the present invention, when the bias magnetic field applying means is further provided, and the bias magnetic field is temporarily imparted to all of the magnetoresistive elements, the free layers are saturated and the magnetization directions of the free layers may be temporarily aligned (that is, it may be returned to the initial state). Therefore, if the bias magnetic field is applied to all of the magnetoresistive elements, and then the magnetic field to be detected is detected, although the current to be detected is extremely weak, the detection may be performed with the further higher precision and stability. Especially, in the case that the directions of the anisotropic fields of the free layers included in both of the first and the second magnetoresistive elements, and the directions of the anisotropic fields of the free layers included in all of the first to the fourth magnetoresistive elements correspond to the central axis, the refresh magnetic field is applied in the direction of the anisotropic field so that the initial state may be easily obtained.

Other and further objects, features and advantages of the invention will appear more fully from the following description.

BRIEF DESCRIPTION OF THE DRAWINGS

FIG. 2 is an exploded perspective view of the current sensor shown in FIG. 1.

DETAILED DESCRIPTION OF THE PREFERRED EMBODIMENTS

Preferred embodiments of the present invention will be described in detail with reference to the accompanying drawings.

First Embodiment

Figure 1:
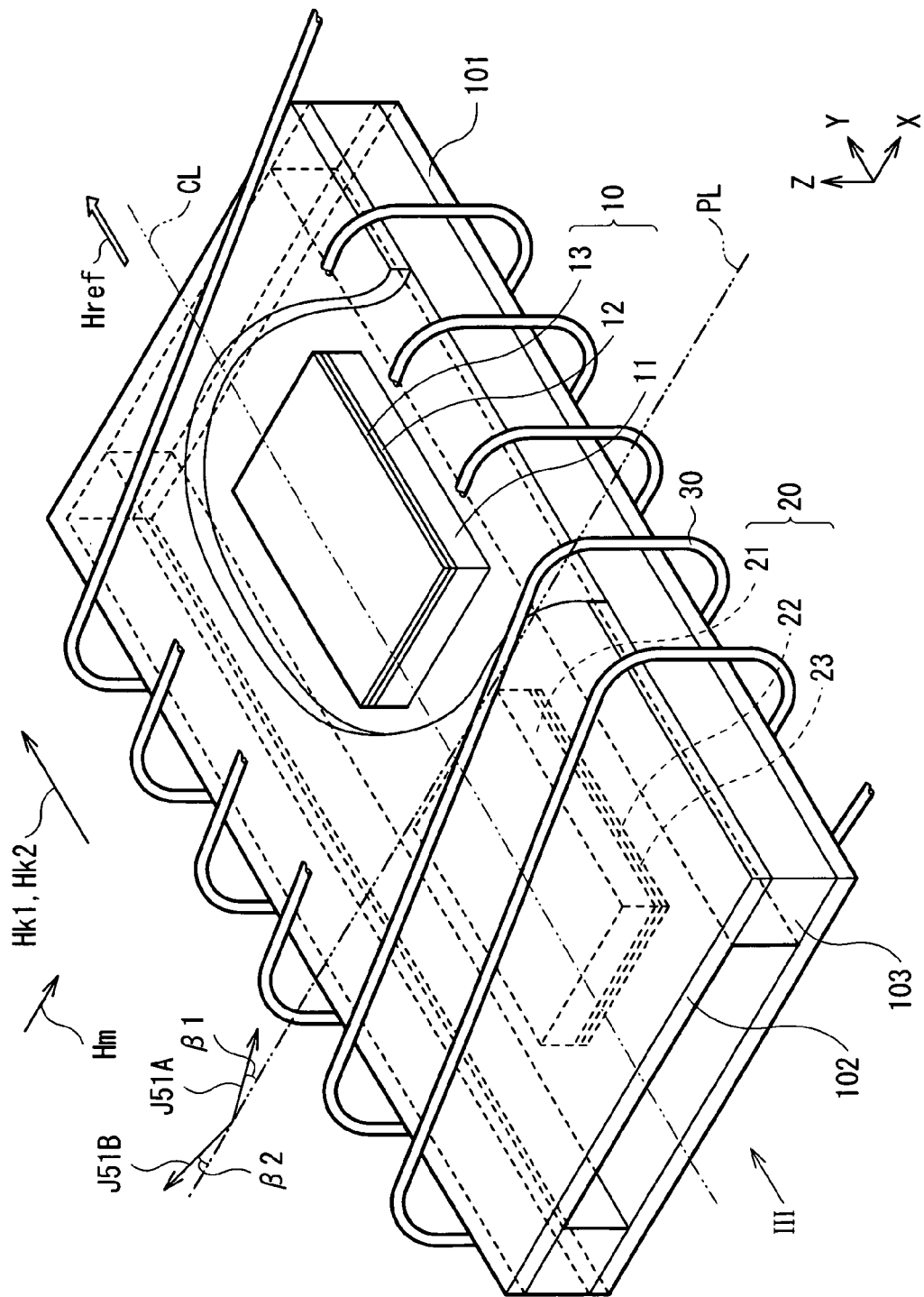
FIG. 1 is a fracture view partially showing a configuration of a current sensor in a first embodiment of the present invention.
Figure 3A:
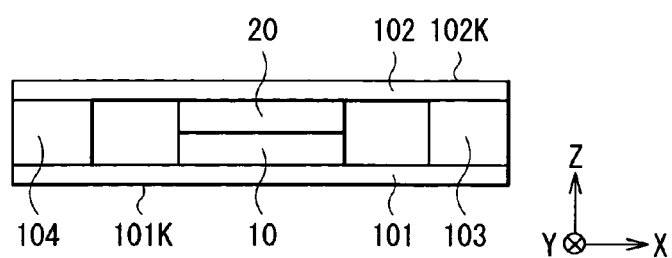
FIGS. 3A and 3B are a side view and a cross-sectional view of the current sensor shown in FIG. 1, respectively.
Figure 3B:
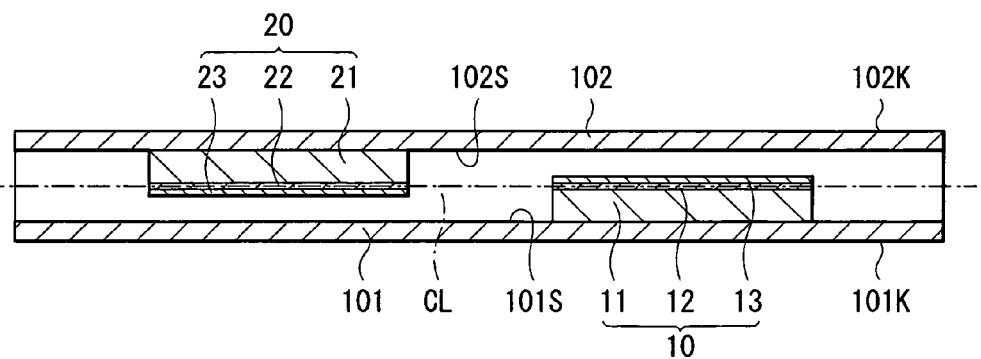

First, with reference to FIGS. 1, 2, 3A and 3B, an overall configuration of a current sensor in a first embodiment of the present invention will be described. FIG. 1 is fracture view partially showing a perspective configuration of the current sensor of the first embodiment. FIG. 2 is an exploded perspective view of FIG. 1. FIG. 2 also illustrates a conductor 40 to which a current to be detected Im is supplied, and shows a positional relationship between the current sensor and the conductor 40. Also, FIG. 3A is a configuration view as viewed from the direction of arrow III of FIG. 1. FIG. 3B is a cross-sectional view including a first module 10 and a second module 20 which will be described later. Meanwhile, in FIGS. 1, 3A and 3B, the conductor 40 which will be described later is omitted, and in FIGS. 2, 3A and 3B, a coil 30 which will be described later is omitted.

The current sensor includes the first module 10 and the second module 20. The current sensor is disposed in the vicinity of the conductor 40 (refer to FIG. 2) having a straight line section 41 which extends, for example, along an Y-axis, and detects presence or absence, and a magnitude of the current to be detected Im such as a control signal flowing through the conductor 40. The first module 10 and the second module 20 include MR (magnetoresistive) elements 5A and 5B (which will be described later) having stacked structures, respectively. The first module 10 and the second module 20 are in such a relationship that the first module 10 and the second module 20 come coincident with each other when performing a rotational operation around a central axis CL of rotation parallel to stack surfaces of the stacked structure or performing both of the rotational operation and a parallel shift operation. The central axis CL is preferably located in parallel to stack surfaces of the stacked structures of the MR elements 5A and 5B, and located in parallel to the direction of anisotropic fields Hk1 and Hk2 which will be described later. In the first embodiment, the central axis CL is set as the Y-axis, the axis orthogonal to the Y-axis in the plane where the stack surfaces of the stacked structures of the MR elements 5A and 5B extend is set as an X-axis, and the axis orthogonal to the X-axis and the Y-axis is set as a Z-axis.

The conductor 40 is a thin film formed by a plating method or the like by using highly-conductive metal materials such as copper (Cu). When the current to be detected Im is supplied to the conductor 40, an induced magnetic field Hm is generated in the periphery of the straight line section 41. End portions 40S and 40E of the conductor 40 are connected to an external wiring through a contact layer (not shown in the figure) or the like. The first module 10 and the second module 20 detect the induced magnetic field Hm, and are disposed along the straight line section 41 in the layer level different from the layer level where the straight line section 41 extends. That is, the first module 10 and the second module 20 are provided in a region which overlaps with the straight line section 41, when viewed from the stacking direction.

In the current sensor, when the current to be detected Im flows from the end portion 40S to the end portion 40E, the induced magnetic field Hm is imparted in the +X direction to the MR element 5A of the first module 10 and to the MR element 5B of the second module 20. When the current to be detected Im flows from the end portion 40E to the end portion 40S, the induced magnetic field Hm is imparted in the −X direction to the MR element 5A and the MR element 5B.

Figure 11:
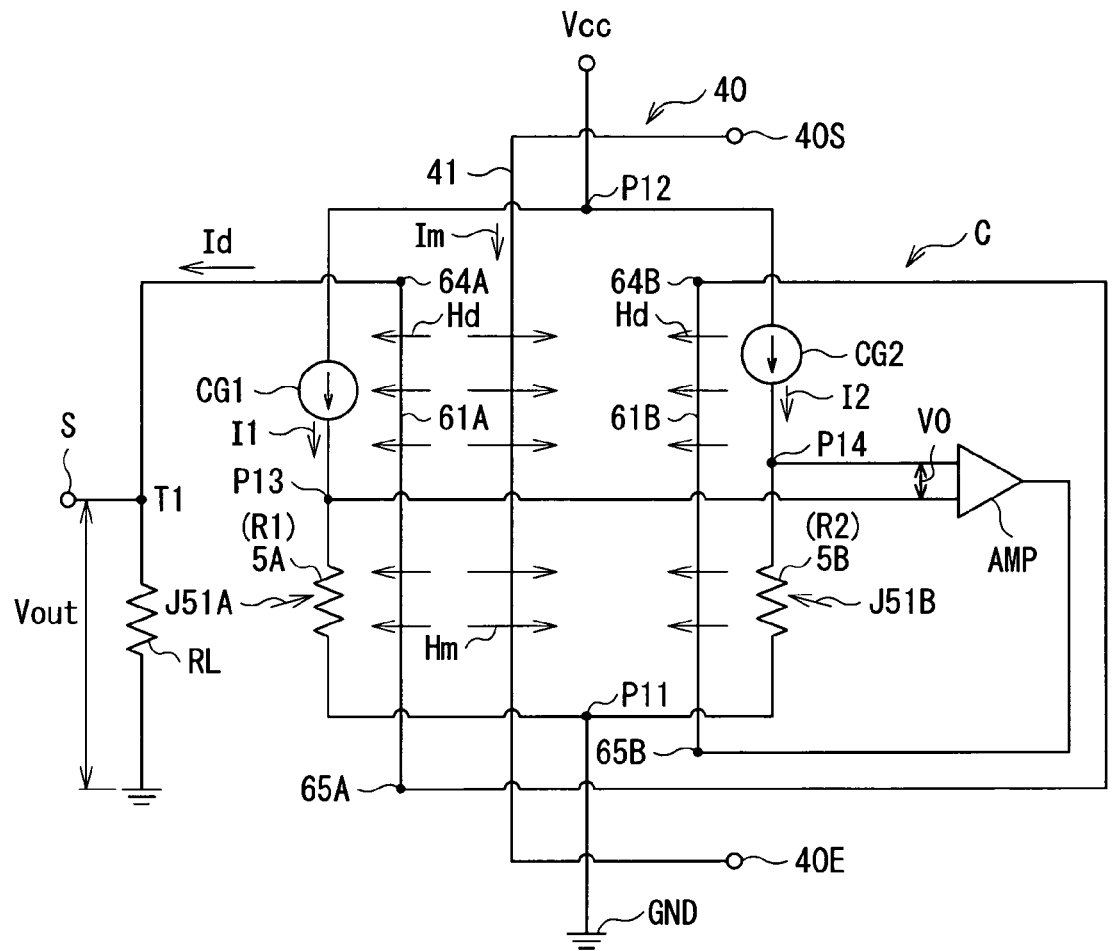
FIG. 11 is a circuit view showing the circuit configuration of the current sensor shown in FIG. 1.

The first module 10 is fixed on a plane 101S of an integrated substrate 101 which functions as a support member. On the other hand, the second module 20 is fixed on a plane 102S of an integrated substrate 102 which functions as the support member. In the integrated substrate 101 and the integrated substrate 102, the plane 101S and the plane 102S are disposed so as to face each other with a spacer 103 and a spacer 104 in between. Both of a plane 101K located on the side opposite from the plane 101S of the integrated substrate 101, and a plane 102K located on the side opposite from the plane 102S of the integrated substrate 102 are reference planes, and are disposed in parallel to the straight line section 41 of the conductor 40. The integrated substrates 101 and 102, and the spacers 103 and 104 are composed of, for example, aluminum oxide ($Al_2O_3$). Each of the integrated substrates 101 and 102 is a printed circuit board having a wiring pattern (not shown in the figure) or a differential detector AMP (which will be described later). By the integrated substrates 101 and 102, and element substrates 11 and 21, a circuit (will be described later) shown in FIG. 11 is configured.

Further, the current sensor includes a coil 30 generating a refresh magnetic field Href. The coil 30 is a conducting wire winding around the central axis CL in the vicinity of the integrated substrates 101 and 102. The coil 30 generates the refresh magnetic field Href in the direction (here, in the +Y direction) of the anisotropic fields Hk1 and Hk2 by the flowing current, and applies the refresh magnetic field Href to the MR elements 5A and 5B. The refresh magnetic field Href has an intensity equal to or larger than that of the magnetic field where magnetizations of the free layers 53A and 53B (will be described later) are saturated.

In the first module 10, an element substrate 11, an MR element layer 12, and a thin film coil layer 13 are stacked in this order from the side of the integrated substrate 101. The element substrate 11 is adhered to the integrated substrate 101 with an adhesion layer (not shown in the figure) in between. Similarly, in the second module 20, an element substrate 21, an MR element layer 22, and a thin film coil layer 23 are stacked in this order from the side of the integrated substrate 102. The element substrate 21 is adhered to the integrated substrate 102 with the adhesion layer (not shown in the figure) in between.

Figure 4:
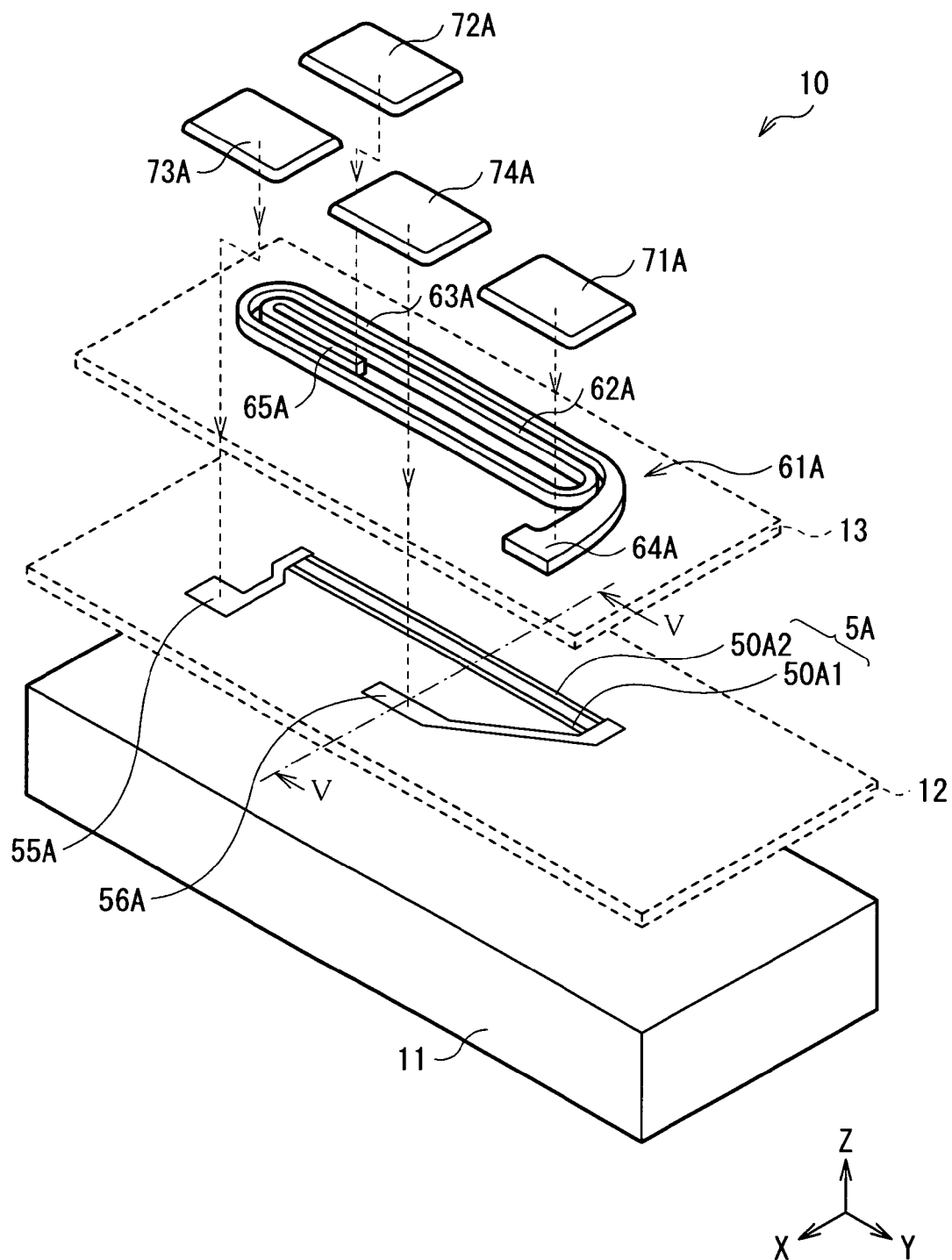
FIG. 4 is an exploded perspective view showing the configuration of a first module 10 shown in FIG. 1.
Figure 5:
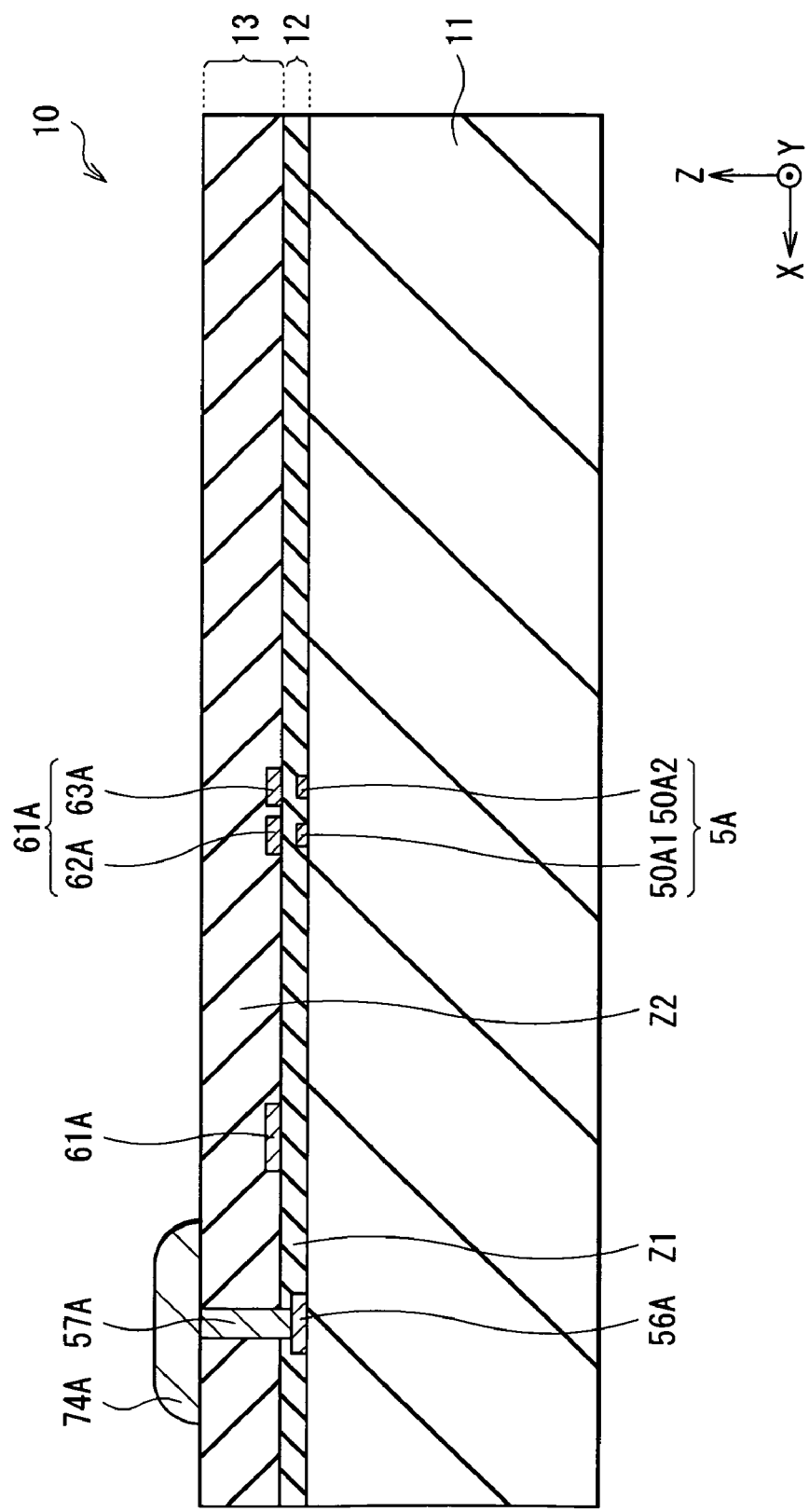
FIG. 5 is a cross-sectional view showing the configuration of the first module 10 shown in FIG. 1.

Here, with reference to FIGS. 4 and 5, the configuration of the first module 10 will be described in detail. FIG. 4 is an exploded perspective view showing the first module 10 in an enlarged scale. FIG. 5 is a cross-sectional view as viewed from the direction of section line V-V of FIG. 4.

In the MR element layer 12, the MR element 5A which has two element patterns 50A1 and 50A2 formed on the element substrate 11 of silicon wafer or the like is covered with an insulation layer Z1 of aluminum oxide ($Al_2O_3$) or the like, the element substrate 11 having a thickness of, for example, approximately 100 μm. The element patterns 50A1 and 50A2 have spin-valve structures in which a plurality of function films including a magnetic layer are stacked, and exhibits a giant magnetoresistive effect. The element patterns 50A1 and 50A2 extend in parallel to each other along the Y-axis on the element substrate 11, and are disposed side by side along the X-axis which is orthogonal to the Y-axis. Also, the element patterns 50A1 and 50A2 are connected in parallel to each other by a connection section 55A and a connection section 56A. The detailed configuration of the element patterns 50A1 and 50A2 will be further described later.

In the thin film coil layer 13, a thin film coil 61A formed on the MR element layer 12 is covered with an insulation layer Z2 of $Al_2O_3$ or the like. The thin film coil 61A is a thin film pattern configured to wind in a film plane (in an X-Y plane) of the thin film coil layer 13, and includes wiring portions 62A and 63A extending along the Y-axis in correspondence with the element patterns 50A1 and 50A2, respectively. The thin film coil 61A is composed of highly-conductive metal materials such as copper (Cu), and functions as a part of a compensation current line C (will be described later) when a compensation current Id (will be described later) is supplied.

Electrode films 71A to 74A are provided on the thin film coil layer 13. Among them, the electrode film 73A is connected to a connection section 55A with a contact hole (not shown in the figure) in between. The electrode film 74A is connected to a connection section 56A with a contact hole 57A (refer to FIG. 5) in between. The element patterns 50A1 and 50A2 are formed so as to have the thickness of, for example, 0.8 μm by using sputtering method or the like. An end portion 64A which is one end of the thin film coil 61A is connected to the electrode film 71A with the contact hole (not shown in the figure) in between. An end portion 65A which is the other end of the thin film coil 61A is connected to the electrode film 72A with the contact hole (not shown in the figure) in between. In addition, in the case that the current to be detected Im flows in the −Y direction, the compensation current Id flows from the end portion 65A to the end portion 64A in the first module 10.

Figure 6:
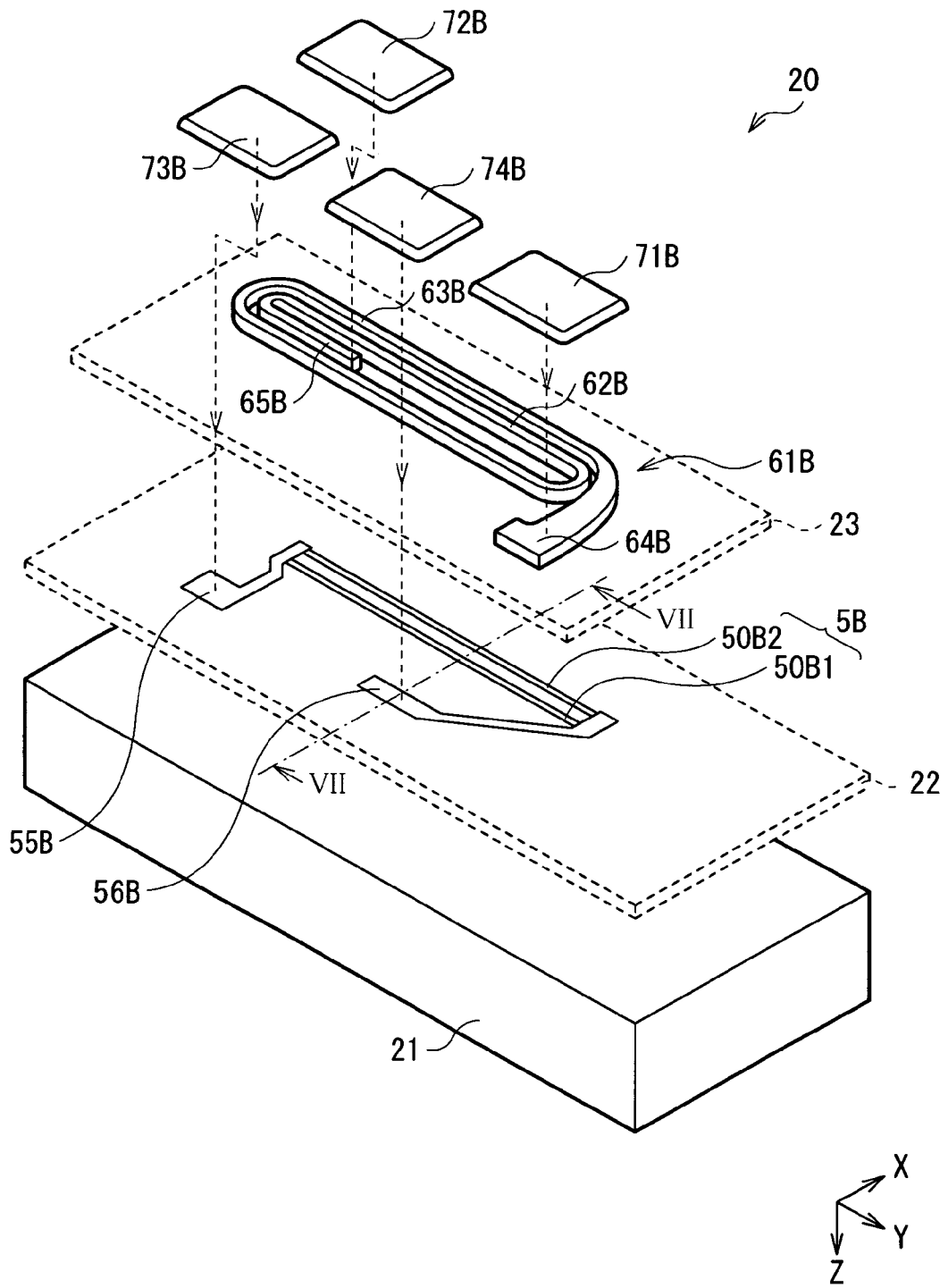
FIG. 6 is an exploded perspective view showing the configuration of a second module 20 shown in FIG. 1.
Figure 7:
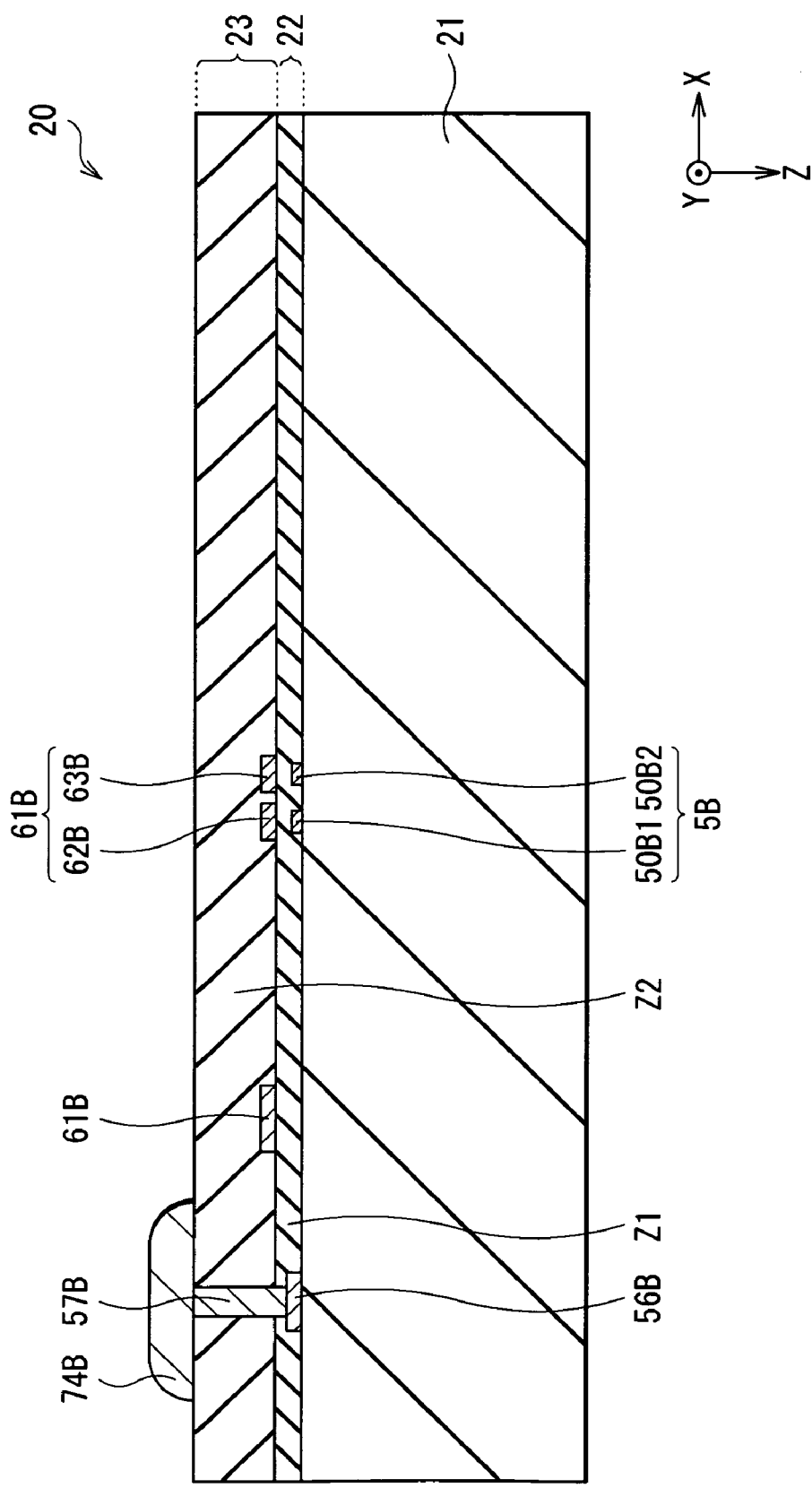
FIG. 7 is a cross-sectional view showing the configuration of the second module 20 shown in FIG. 1.

The second module 20 substantially has a configuration similar to that of the first module 10. That is, as shown in FIGS. 6 and 7, the configuration of the second module 20 is that an element substrate 21, an MR element layer 22, and a thin film coil layer 23 correspond to the element substrate 11, the MR element layer 12, and the thin film coil layer 13, respectively. FIG. 6 is an exploded perspective view showing the second module 20 in the enlarged scale. FIG. 7 is a cross-sectional view as viewed from the direction of section line VII-VII of FIG. 6. In the MR element layer 22, an MR element 5B corresponding to the MR element 5A has element patterns 50B1 and 50B2 corresponding to the element patterns 50A1 and 50A2. The element patterns 50B1 and 50B2 are connected in parallel by connection sections 55B and 56B. In the thin film coil layer 23, a thin film coil 61B corresponding to the thin film coil 61A includes wiring portions 62B and 63B extending along the Y-axis corresponding to the element patterns 50B1 and 50B2, respectively. Similarly to the thin film coil 61A, the thin film coil 61B functions as a part of the compensation current line C, when the compensation current Id is supplied. Further, electrode films 71B, 72B, 73B, and 74B are provided on the thin film coil layer 23. Among them, the electrode film 73B is connected to a connection section 55B with a contact hole (not shown in the figure) in between. The electrode film 74B is connected to a connection section 56B with a contact hole 56B (refer to FIG. 7) in between. An end portion 64B which is one end of the thin film coil 61B is connected to the electrode film 71B with the contact hole (not shown in the figure) in between. An end portion 65B which is the other end of the thin film coil 61B is connected to the electrode film 72B with the contact hole (not shown in the figure) in between. In the case that the current to be detected Im flows in the −Y direction, the compensation current Id flows from the end portion 64B to the end portion 65B in the second module 20.

As will be described later, the magnetization direction J51B in the element patterns 50B1 and 50B2 in the second module 20 is different from the magnetization direction J51A in the element patterns 50A1 and 50A2 in the first module 10.

Figure 8A:
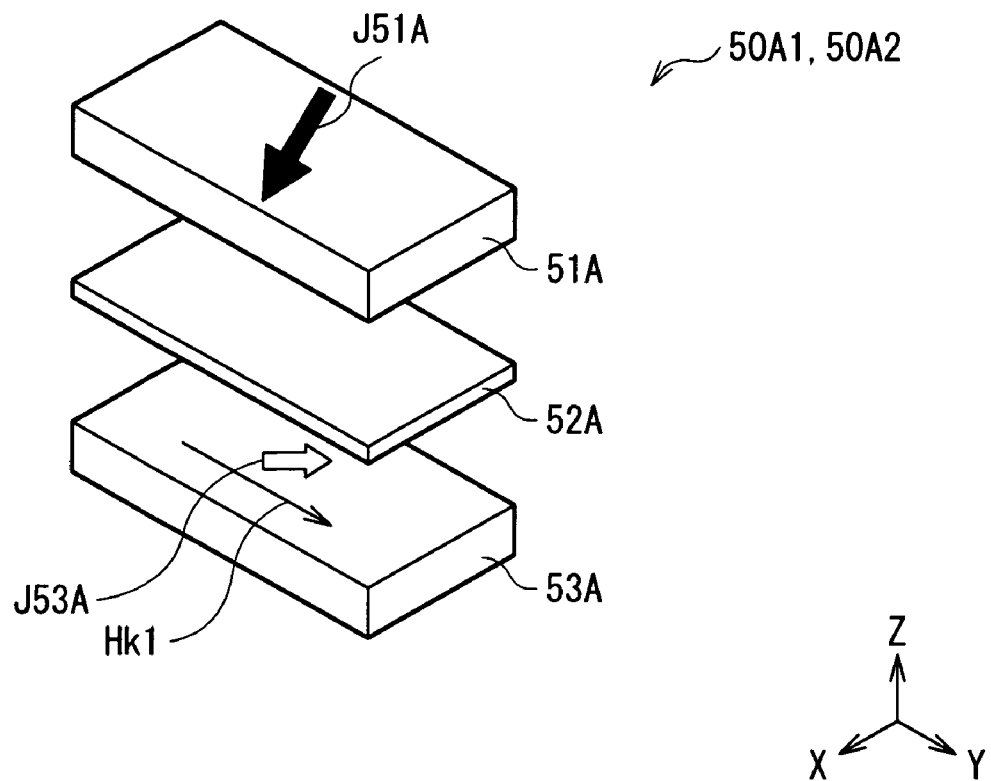
FIGS. 8A and 8B are exploded perspective views showing the configurations of element patterns 50A1 and 50A2 as main parts of the first module 10 shown in FIG. 1.
Figure 9A:
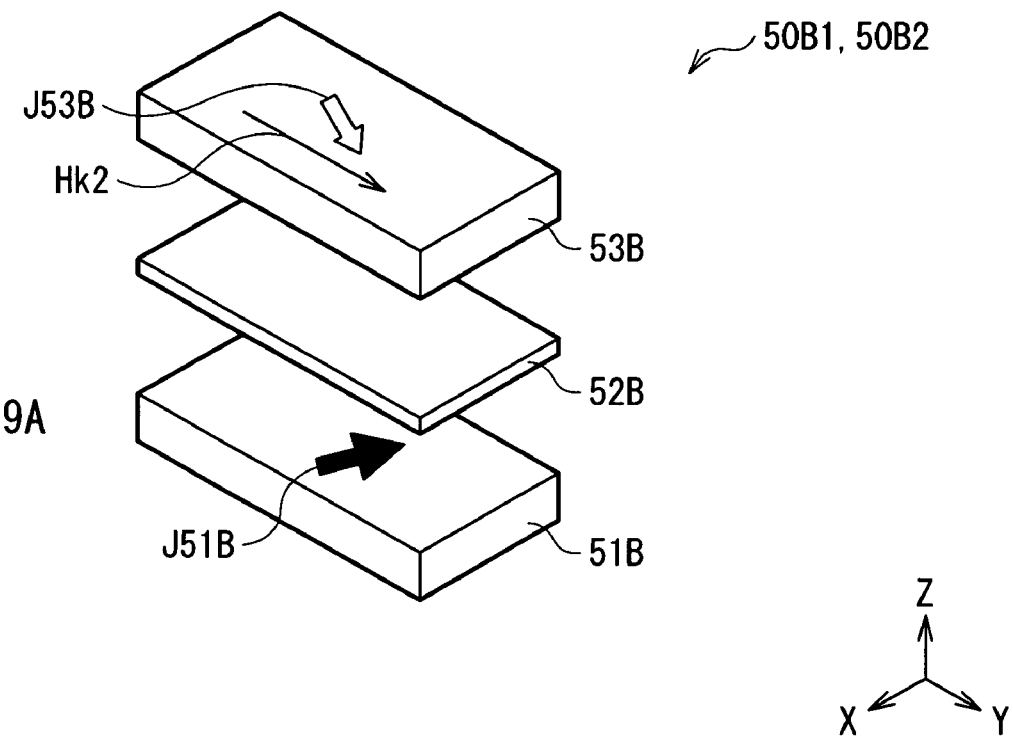
FIGS. 9A and 9B are exploded perspective views showing the configurations of element patterns 50B1 and 50B2 as main parts of the second module 20 shown in FIG. 1.

FIG. 8A is an exploded perspective view showing the element patterns 50A1 and 50A2 as in FIGS. 4 and 5, in the enlarged scale. FIG. 9A is an exploded perspective view showing the element patterns 50B1 and 50B2 as in FIGS. 6 and 7, in the enlarged scale. In each of the element patterns 50A1 and 50A2, for example, a free layer 53A having a magnetization J53A which changes the direction according to an external magnetic field including the induced magnetic field Hm, a nonmagnetic intermediate layer 52A which expresses no specific magnetization direction, and a pinned layer 51A which has the magnetization J51A pinned in the specific direction are stacked in this order from the side of the element substrate 11. Similarly, in each of the element patterns 50B1 and 50B2, for example, a free layer 53B having a magnetization J53B which changes the direction according to the eternal magnetic field including the induced magnetic field Hm, a nonmagnetic intermediate layer 52B which expresses no specific magnetization direction, and a pinned layer 51B which has the magnetization 51B pinned in the specific direction are stacked in this order from the side of the element substrate 21.

The free layer 53A expresses the anisotropic field Hk1 in the +Y direction. The free layer 53B also expresses the anisotropic field Hk2 in the +Y direction. Here, the terms "anisotropic field Hk1" and "anisotropic field Hk2" indicate all the anisotropic fields including anisotropic field components caused by crystal structures of the free layers 53A and 53B, and the anisotropic field components caused by shapes of the free layers 53A and 53B. In the first embodiment, the anisotropic fields Hk1 and Hk2 are parallel to the central axis CL (the Y-axis). As shown in FIG. 1, the magnetizations J51A and 51B of the pinned layers 51A and 51B are slightly inclined from an orthogonal axis PL which is orthogonal to the central axis CL. In detail, the magnetization direction J51A is the direction inclined at an angle β1 from the +X direction to the +Y direction. The magnetization direction J51B is the direction inclined at an angle β2 from the −X direction to the +Y direction. The angles β1 and β2 are preferably equal to each other. Both of the relative angle between the magnetization direction J51A and the direction of the anisotropic field Hk1, and the relative angle between the magnetization direction J51B and the direction of the anisotropic field Hk2 are larger than 0° and smaller than 90°.

Figure 8B:
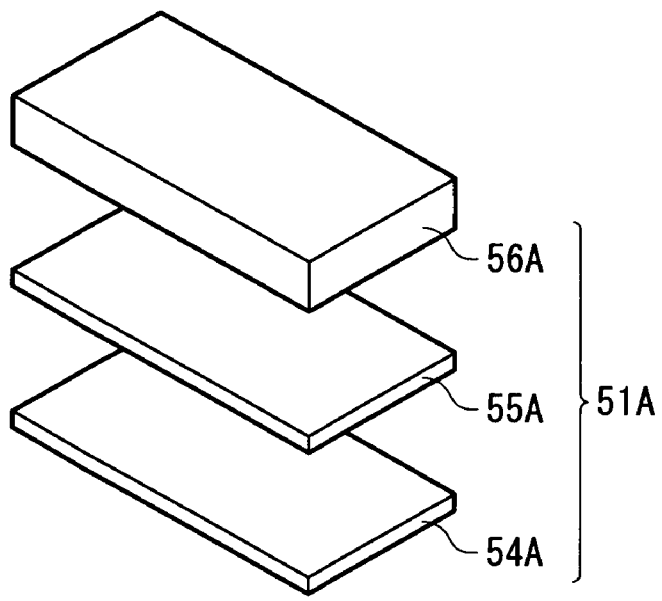
Figure 9B:
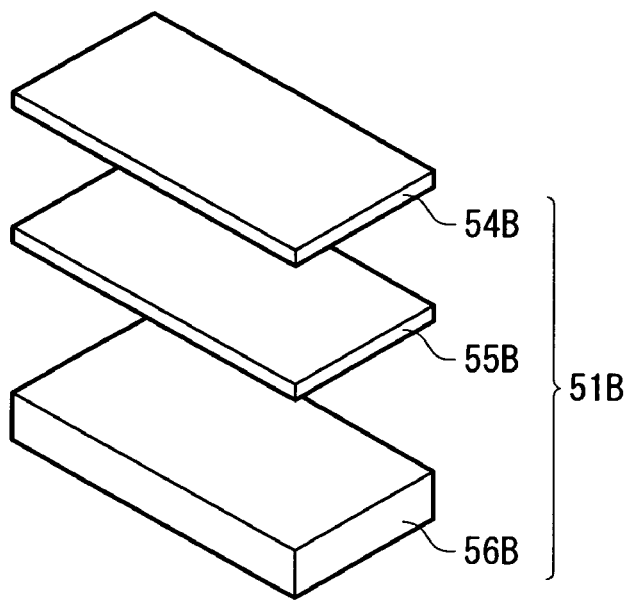

FIGS. 8B and 9B show the detailed configurations of the pinned layers 51A and 51B. In the pinned layer 51A, a magnetization pinned film 54A, an antiferromagnetic layer 55A, and a protection film 56A are stacked in this order from the side of the intermediate layer 52A. In the pinned layer 51B, a magnetization pinned film 54B, an antiferromagnetic layer 55B, and a protection film 56B are stacked in this order from the side of the intermediate layer 52B. The magnetization pinned films 54A and 54B are composed of ferromagnetic materials such as cobalt (Co) and cobalt-iron alloy (CoFe). The directions of the magnetizations which the magnetization pinned films 54A and 54B indicate become the directions of the magnetizations J51A and J51B of the pinned layers 51A and 51B as a whole, respectively. On the other hand, the antiferromagnetic layers 55A and 55B are composed of antiferromagnetic materials such as platinum-manganese alloy (PtMn) and iridium-manganese alloy (IrMn). The antiferromagnetic layers 55A and 55B are in the state where a spin magnetic moment in a certain direction, and a spin magnetic moment in a direction opposite from that of the former spin magnetic moment are completely canceled by each other. Also, the antiferromagnetic layers 55A and 55B operate so as to pin the directions of the magnetizations of the magnetization pinned films 54A and 54B. The protection films 56A and 56B are composed of chemically-stable nonmagnetic materials such as tantalum (Ta) and hafnium (Hf), and protect the magnetization pined films 54A and 54B and the antiferromagnetic films 55A and 55B. Further, the free layers 53A and 53B are composed of soft magnetic materials such as nickel-iron alloy (NiFe). The intermediate layers 52A and 52B are composed of highly-conductive nonmagnetic materials such as copper and gold (Au).

As described above, the element patterns 50A1 and 50A2 constituting the MR element 5A, and the element patterns 50B1 and 50B2 constituting the MR element 5B are in such a relationship that the element patterns 50A1 and 50A2, and the element patterns 50B1 and 50B2 come coincident with each other when performing a rotational operation around the central axis CL of rotation parallel to stack surfaces of the stacked structure or performing both of the rotational operation and a parallel shift operation. Further, the element patterns 50A1 and 50A2, and the element patterns 50B1 and 50B2 are located in the same layer level including an imaginary common plane along the stack surfaces of the stacked structures of the element patterns 50A1, 50A2, 50B1, and 50B2 (refer to FIG. 3B). Here, the expression "same layer level" means that at least each of the element patterns 50A1, 50A2, 50B1, and 50B2 is partially located in the height level equal to each other in the thickness direction. That is, when each of the element patterns 50A1, 50A2, 50B1, and 50B2 is shifted in parallel in the X-Y plane, at least each of the element patterns 50A1, 50A2, 50B1, 50B2 is partially overlapped with each other. Especially, the free layers 53A in the element patterns 50A1 and 50A2, and the free layers 53B in the element patterns 50B1 and 50B2 are preferably located in the height level equal to each other including the imaginary common plane.

Here, FIGS. 8A and 9A show a no-load state where no external magnetic field including the induced magnetic field Hm is imparted. In this case, a vector of the magnetization in the MR element 5A and the vector of the magnetic field in the MR element 5B are in such a relationship that the vector of the magnetization in the MR element 5A and the vector of the magnetic field in the MR element 5B come coincident with each other when performing a rotational operation around the central axis CL of rotation parallel to stack surfaces of the stacked structure or performing both of the rotational operation and a parallel shift operation. Also, the magnetization J53A of the free layer 53A is directed in the direction of a synthetic magnetic field H1 of an exchange coupling magnetic field Hin1 generated between the pinned layer 51A and the free layer 53A, and the anisotropic field Hk1 of the free layer 53A (FIG. 1A). Similarly, the magnetization J53B of the free layer 53B is directed in the direction of a synthetic magnetic field H2 of an exchange coupling magnetic field Hin2 generated between the pinned layer 51B and the free layer 53B, and the anisotropic field Hk2 of the free layer 53B (FIG. 10B). On the other hand, the magnetizations J51A and J51B of the pinned layers 51A and 51B are directed in the direction forming relative angles with the anisotropic fields Hk1 and Hk2, the relative angles being larger than 0° and smaller than 90°, for example, angles α1 and α2 with the synthetic magnetic fields H1 and H2, respectively. Regardless of the presence or absence of the induced magnetic field Hm, the angles α1 and α2 are preferably 90°. This is because, by such a configuration, the MR elements 5A and 5B express the maximum output. The exchange coupling magnetic fields Hin1 and Hin2 have the vectors exactly opposite to the magnetizations J51A and J51B, respectively. The magnetization J51A, the anisotropic field Hk1, and the exchange coupling magnetic field Hin1 of the element patterns 50A1 and 50A2 are preferably equal to the magnetization J51B, the anisotropic field Hk2 and the exchange coupling magnetic field Hin2 of the element patterns 50B1 and 50B2, respectively. In addition, FIGS. 10A and 10B are explanatory views for explaining the directions and the magnitude of the magnetizations, and the direction and the magnitude of the magnetic fields in the element patterns 50A1 and 50A2, and the element patterns 50B1 and 50B2.

Figure 10A:
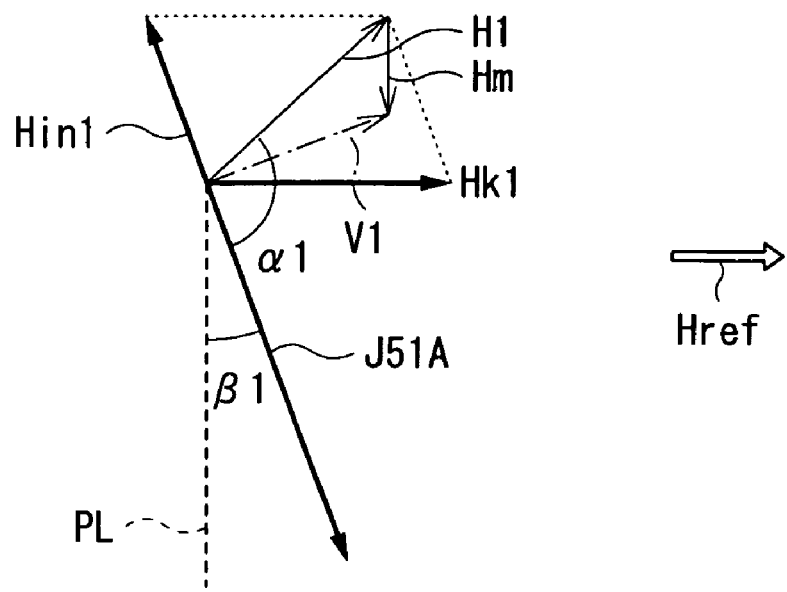
FIGS. 10A and 10B are explanatory views illustrating the relationship between a magnetization direction and the direction of a magnetic field in the element patterns shown in FIGS. 8A and 8B.
Figure 10B:
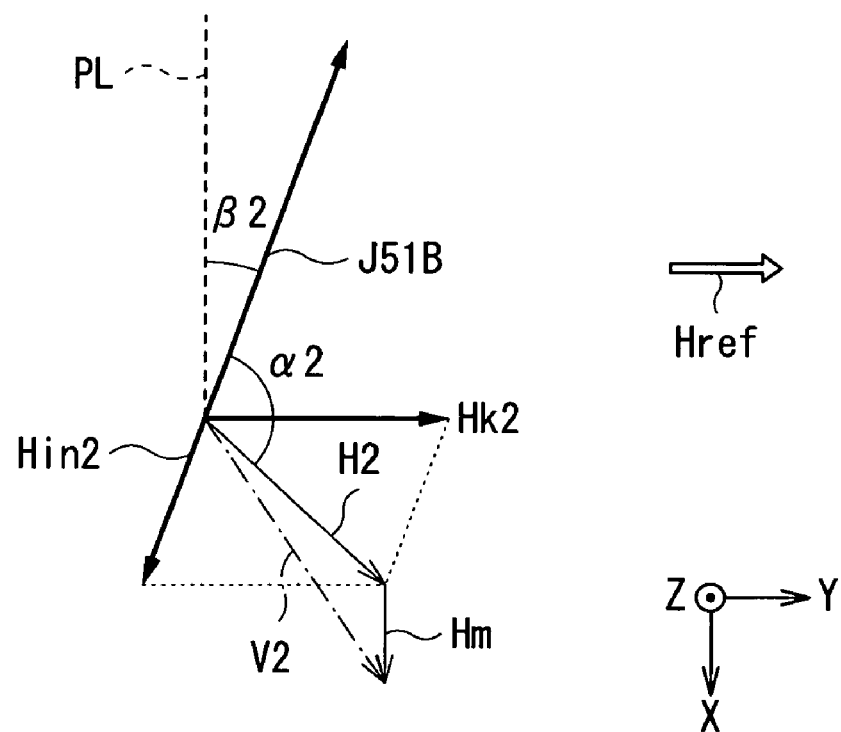

When the induced magnetic field Hm shown in, for example, FIG. 10A is applied in the +X direction to the element patterns 50A1 and 50A2, the magnetization J53A of the free layer 53A is changed to be directed in the direction of a synthetic vector V1 of the synthetic magnetic field H1 and the induced magnetic field Hm. At this time, the angle between the magnetization J51A and the magnetization J53A becomes smaller than the angle α1 so that a resistance value R1 of the MR element 5A is lowered. On the other hand, when the induced magnetic field Hm as shown in FIG. 10B is applied in the same direction (+X direction) as in FIG. 1A, to the element patterns 50B1 and 50B2, the magnetization J53B of the free layer 53B is changed to be directed in the direction of a synthetic vector V2 of the synthetic magnetic field H2 and the induced magnetic field Hm. At this time, the angle between the magnetization J51B and the magnetization J53B becomes larger than the angle α2 so that a resistance value R2 of the MR element 5B is increased. In this way, in the current sensor 1, with the application of the induced magnetic field Hm, the resistance value R1 of the MR element 5A, and the resistance value R2 of the MR element 5B are configured so as to show the changes in the directions opposite to each other.

Next, the circuit configuration of the current sensor of the first embodiment will be described. FIG. 11 is an outline view showing the circuit configuration of the current sensor. FIG. 11 also shows the conductor 40 including the straight line section 41 extending along the Y-axis. The MR elements 5A and 5B are disposed along the straight line section 41. FIG. 11 shows the MR elements 5A and 5B as resistors, respectively. Here, FIG. 11 shows that the induced magnetic field Hm is applied in the +X direction to the MR elements 5A and 5B by the current to be detected Im flowing from the end portion 40S to the end portion 40E.

The first module 10 has the MR element 5A, and also a constant current source CG1 (not shown in FIG. 1) formed on the element substrate 11. On the other hand, the second module 20 has the MR element 5B, and also a current constant source CG2 (not shown in FIG. 1) formed on the element substrate 21. The constant current sources CG1 and CG2 constitute a circuit together with the MR elements 5A and 5B, as shown in FIG. 11. The one end of the MR element 5A and the one end of the MR element 5B (for example, the electrode film 73A and the electrode film 73B) are connected at a first connection point P11. The one end of the constant current source CG1 and the one end of the constant current source CG2 are connected at a second connection point P12. The first connection point P11 is finally grounded, and a power supply Vcc is connected to the second connection point P12. Further, the other end (the electrode film 74A on the side opposite from the first connection point P11) of the MR element 5A is connected to the other end (the end portion on the side opposite from the second connection point P12) of the current constant source CG1 at the third connection point P13. The other end (the electrode film 74A on the side opposite from the first connection point P11) of the MR element 5B is connected to the other end (the end portion on the side opposite from the second connection point P12) of the constant current source CG2 at the fourth connection point P14. Here, the constant current source CG1 supplies a constant current I1 to the MR element 5A, and the constant current source CG2 supplies a constant current I2 to the MR element 5B.

Further, the current sensor has a differential detector AMP. The third connection point P13 and the fourth connection point P14 are connected to the input side of the differential detector AMP, respectively. The compensation current line C including the thin film coil 61A and the thin film coil 61B connected in series is connected to the output side of the differential detector AMP. The differential detector AMP detects the potential difference (difference between voltage drops respectively generated in the MR elements 5A and 5B) between the third connection point P13 and the fourth connection point P14, when a voltage is applied between the first connection point P11 and the second connection point P12. Then, the differential detector AMP supplies the compensation current Id to the compensation current line C. The end portion of the compensation line C on the side opposite from the differential detector AMP is grounded via a resistor RL. A compensation current detection means S is connected to the resistor RL on the side of the differential detector AMP, at the connection point T1. Here, a compensation magnetic field Hd is generated in the direction opposite from that of the induced magnetic field Hm in the wiring portions 62A and 63A of the thin film coil 61A and the wiring portions 62B and 63B of the thin film coil 61B, by the compensation current Id flowing on the compensation current line C. That is, the compensation magnetic field Hd is generated in the −X direction, and operates in the direction so as to cancel the induced magnetic field Hm.

Figure 12A:
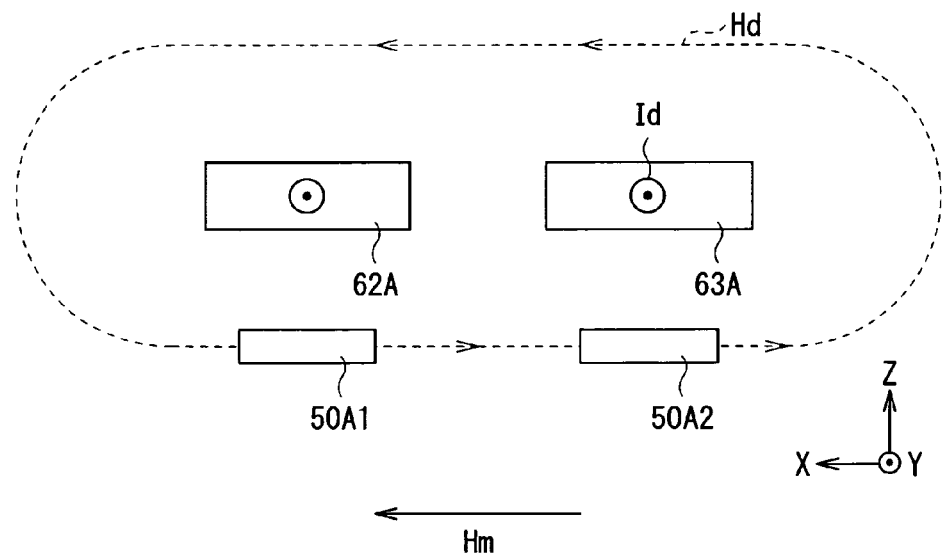
FIGS. 12A and 12B are explanatory views illustrating the relationship between the direction of a compensation current Id and the direction of a compensation magnetic field Hd in the first module 10 and the second module 20 shown in FIG. 1.
Figure 12B:
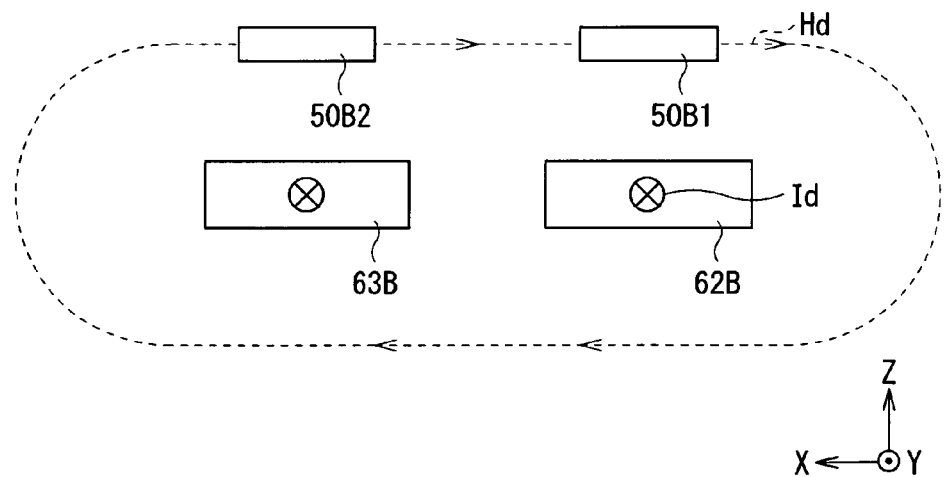

With reference to FIGS. 11, 12A, and 12B, this operation will be described in detail. Each of FIGS. 12A and 12B shows the main part of the cross-sectional configurations shown in FIGS. 5 and 7, in an enlarged scale, and schematically shows the relationship between the direction of the current flowing, and the direction of the magnetic field generated by the current. Here, when the current to be detected Im is supplied to the conductor 40 (not shown in the figure) in the −Y direction (the direction from the front side of the drawing surface to the back side), the induced magnetic field Hm is applied to the MR elements 5A and 5B in the +X direction (in the left direction of the drawing surface). At this time, the compensation current Id flows in the +Y direction through the wiring portions 62A and 63A in correspondence with the element patterns 50A1 and 50A2, respectively, and flows in the −Y direction in the wiring portions 62B and 63B in correspondence with the element patterns 50B1 and 50B2, respectively. Therefore, by the right-handed screw rule, the compensation magnetic field Hd is generated in the counterclockwise direction in the periphery of the wiring portions 62A and 63A on the drawing surface. On the other hand, the compensation magnetic field Hd is generated in the clockwise direction in the periphery of the wiring portions 62B and 63B on the drawing surface. As a result, the compensation magnetic field Hd is imparted to the each of the element patterns 50A1, 50A2, 50B1, and 50B2 in the −X direction (in the right direction of the drawing surface) (that is, the compensation magnetic field Hd is imparted in the direction opposite from that of the induced magnetic field Hm).

Next, a method of manufacturing the current sensor will be described.

Figure 13:
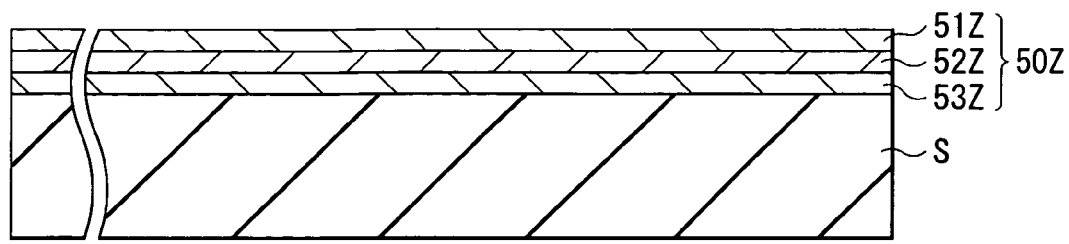
FIG. 13 is a cross-sectional view indicating a step for explaining a method of manufacturing the current sensor shown in FIG. 1.
Figure 14:
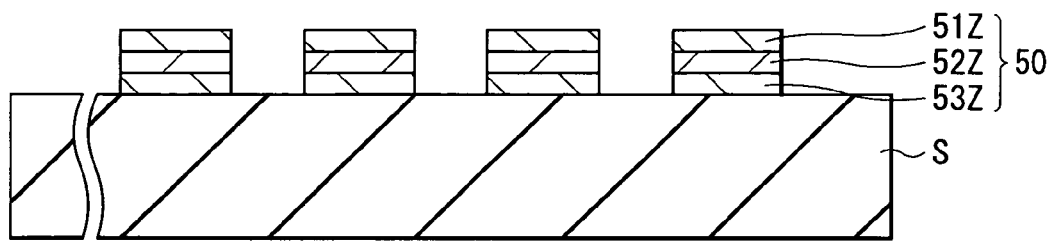
FIG. 14 is a cross-sectional view for illustrating the step succeeding FIG. 13.
Figure 15:
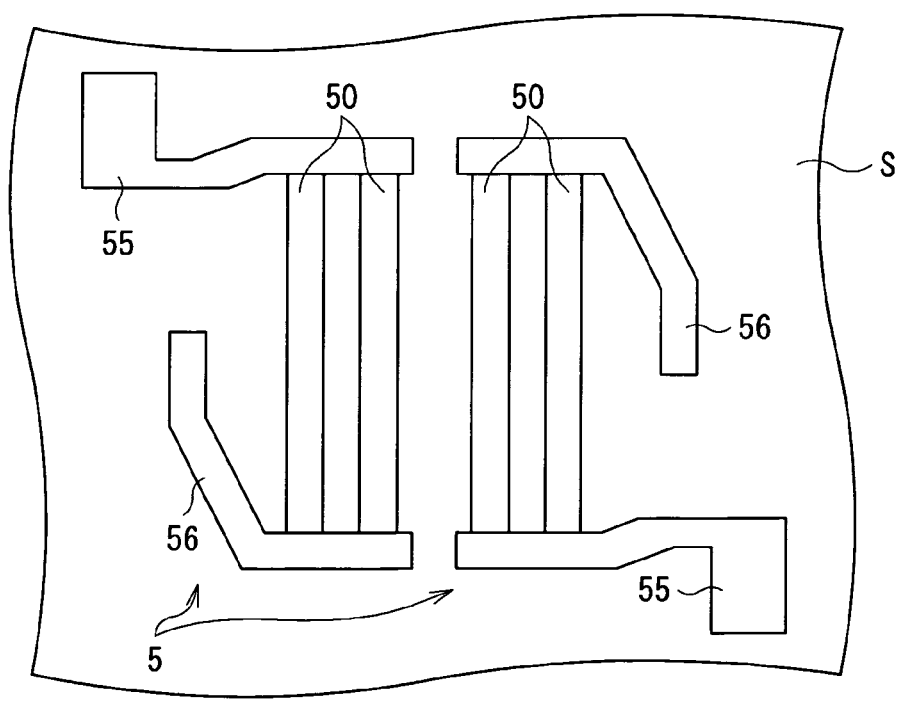
FIG. 15 is a top view for illustrating the step succeeding FIG. 14.

First, a plurality of MR elements are collectively formed on the surface of the substrate S such as a silicon wafer. Specifically, as shown in FIG. 13, a free layer 53Z composed of soft magnetic materials such as Nife, an intermediate layer 52Z composed of nonmagnetic conductive materials such as copper, and a pinned layer 51Z composed of materials (for example, CoFe) having a coercive force larger than that of the free layer 53Z are stacked in this order on the substrate S, and thereby a stacked film 50Z is formed. At this time, the free layer 53 is deposited while the magnetic field is wholly applied in a certain direction so that the direction of the anisotropic field Hk is set. After the formation of the stacked film 50Z, as shown in FIG. 14, patterning is performed on the stacked film 50Z by photolithography method or the like, and thereby a plurality of element patterns 50 composed of the intermediate layer 52 and the pinned layer 51 are formed on the substrate S in the predetermined position, respectively, the plurality of element patterns 50 having the predetermined shape and dimension. In the pinned layer 51, the magnetization is correctively pinned (regulated) (not shown in the figure) in the direction different from that of the anisotropic field Hk. Specifically, annealing is performed for approximately four hours at the temperature of 250° C. or more, and 400° C. or less so as to collectively set the magnetization direction, while the magnetic field having an intensity of 1.6 kA/m or more, and 160 kA/m or less in the direction different from that of the anisotropic field Hk (so as to form the relative angle larger than 0° and smaller than 90°). By the regulation process, the angle between the magnetization J51 of the pinned layer 51, and the magnetization J53 of the free layer 53 in the initial state where the external magnetic field is zero is determined. After that, as shown in FIG. 15, the coupling sections 55 and 56 coupling the both ends of a predetermined number (here, two) of element patterns 50 are formed, respectively, and thereby the plurality of MR elements 5 are obtained. FIG. 15 is a top view showing a plan configuration of the MR element 5 which is formed on the substrate S. Then, after the MR element layer is formed by wholly covering the plurality of MR elements 5 with the insulation layer, the plurality of the thin film coils are formed by plating or the like in the position corresponding to each of the MR elements, and, further, the whole region is covered with the other insulation layer.

Next, the substrate S is divided into (cut into) a plurality of pieces so that each piece includes one MR element 5, in order to take out the first module 10 (refer to FIG. 4) where the MR element layer 12 and the thin film coil layer 13 are formed on the element substrate 11, and the second module 20 (refer to FIG. 6) where the MR element layer 22 and the thin film coil layer 23 are formed on the element substrate 21. The relative angle between the magnetization J51 and the magnetization J53 have slight variations even between the MR elements formed on the same substrate. However, in the case of the MR elements formed in the vicinity to each other, the angle has a relatively small variation error. Thus, for manufacturing the current sensor, it is preferable to make a pair of the MR elements selected in the region as small as possible. After the obtained first and the second modules 10 and 20 are adhered to the integrated substrates 101 and 102, respectively, the formation or the wiring of the constant current sources CG1 and CG2 is performed on the integrated substrates 101 and 102. Then, the integrated substrate 101 where the first module 10 is pinned, and the integrated substrate 102 where the second module 20 is pinned are adhered with the spacers 103 and 104 in between so that the integrated substrate 101 and the integrated substrate 102 are located so as to be in such a relationship that the integrated substrate 101 and the integrated substrate 102 come coincident with each other when performing a rotational operation around the central axis CL of rotation parallel to stack surfaces of the stacked structure or performing both of the rotational operation and a parallel shift operation, the central axis CL being located in parallel to the direction of the anisotropic fields Hk1 and Hk2 of the free layers 53A and 53B. Thus, the resistance values R1 and R2 show the changes in the directions opposite to each other, according to the induced magnetic field Hm. Also, when the integrated substrate 101 and the integrated substrate 102 are adhered to each other, each of the element patterns of the integrated substrate 101 and the integrated substrate 102 is located in the same layer level.

Finally, a coil 30 winding around the integrated substrates 101 and 102 which are adhered together is provided. For example, the coil 30 is formed by winding an extra-fine line (approximately Φ30 μm) of copper. Thereby, the current sensor of the first embodiment is completed.

By using the current sensor having such a configuration, a method of detecting the current to be detected Im on the basis of the induced magnetic field Hm will be described.

Hereinafter, with reference to FIG. 11, a method of measuring the induced magnetic field Hm formed by the current to be detected Im will be described.

As a preparation step for detecting the induced magnetic field Hm, by the refresh current flowing through the coil 30, the refresh magnetic field Href (FIGS. 10A and 10B) having a magnitude equal to or larger than the magnetic field where the magnetizations of the free layers 53A and 53B are saturated is temporarily applied to each of the MR elements 5A and 5B along the direction of the anisotropic fields Hk1 and Hk2. Thus, the directions of the magnetizations J53A and J53B of the free layers 53A and 53B may be reset to the initial state. That is, the directions of the magnetizations J53A and J53B may be temporarily aligned in the same direction (the direction of the anisotropic fields Hk1 and Hk2). As a result, a detection error accompanied by the hysteresis phenomenon of the MR elements 5A and 5B may be avoided. Further, because the refresh magnetic field Href is temporarily applied along the direction of the anisotropic fields Hk1 and Hk2, a crystal magnetic anisotropy of the free layers 53A and 53B is stabled (because the anisotropic fields Hk1 and Hk2 are stabled as a result). Thus, the output of the current sensor 1 is stabled on a high level.

In FIG. 11, when the predetermined voltage is applied between the first connection point P11 and the second connection point P12, the constant currents from the constant current sources CG1 and CG2 are referred to as I1 and I2, respectively, and the resistance values of the MR elements 5A and 5B are referred to as R1 and R2, respectively. In the case that the induced magnetic field Hm is not applied, an electric potential V1 at the third connection point P13 is acquired by $$V1 = I1 \times R1,$$

an electric potential V2 at the fourth connection P14 is acquired by $$V2 = I2 \times R2,$$

and thus a potential difference between the third connection point P13 and the fourth connection point P14 is acquired by $$V0 = V1 - V2 \qquad (1)$$
$$= I1 \times R1 - I2 \times R2$$

Here, in the case that the constant current I1 and the constant current I2 are equal to each other (that is, I1=I2=I0), the equation (1) becomes $$V0 = I0 \times (R1 - R2) \qquad (2)$$

In the circuit, when the induced magnetic field Hm is applied, the amount of the resistance change is acquired by measuring the potential difference V0. For example, when the induced magnetic field Hm is applied, if the resistance values R1 and R2 are increased by the amounts of change ΔR1 and ΔR2, respectively, the equation (2) becomes $$V0 = V1 - V2 \qquad (3)$$
$$= I0 \times (R1 - R2)$$
$$= I0 \times \{(R1 + \Delta R1) - (R2 + \Delta R2)\}$$

In the first embodiment, because each of the element patterns 50A1, 50A2, 50B1, and 50B2 of the MR elements 5A and 5B is located in the same layer level which is different from the layer level where the straight line section 41 of the conductor 40 extends, the distance between each of the element patterns 50A1, 50A2, 50B1, and 50B2 and the straight line section 41 is approximately equal to each other. Thus, the induced magnetic field Hm substantially having the equal intensity is imparted to each of the element patterns 50A1, 50A2, 50B1, and 50B2. Thus, the MR elements 5A and 5B more accurately show the amounts of change ΔR1 and ΔR2.

As described above, because the MR elements 5A and 5B are disposed so that each of the resistance values R1 and R2 indicates the change in the direction opposite to each other by the induced magnetic field Hm, the amount of change ΔR1 and the amount of change ΔR2 have opposite indications of positive and negative to each other. Therefore, in the equation (3), the resistance value R1 and the resistance value R2 before the application of the induced magnetic field Hm are canceled by each other. On the other hand, the amount of change ΔR1 and the amount of change ΔR2 are maintained as they are.

Supposedly, in the case that the first and the second MR elements 5A and 5B have exactly same characteristics, that is, in the case that

R1=R2=R and

ΔR1=−ΔR2=ΔR are supposedly satisfied, the equation (3) becomes $$V0 = I0 \times (R1 + \Delta R1 - R2 - \Delta R2) \quad (4)$$
$$= I0 \times (R + \Delta R - R + \Delta R)$$
$$= I0 \times (2 \times \Delta R)$$

Therefore, when the MR elements 5A and 5B in which the relationship between the external magnetic field and the amount of resistance change is already known are used, the magnitude of the induced magnetic field Hm may be measured. The potential difference V0 expressed by the equation (4) is defined by the angle between the synthetic vector V1 and the magnetization J51A, and the angle between the synthetic vector V2 and the magnetization J51B.

If the angle α1 between the magnetization J51A and the synthetic magnetic field H1 does not correspond to the angle α2 between the magnetization J51B and the synthetic magnetic field H2, the offset output is generated (in the equation (2), V0=0 is not satisfied) in the initial state which is a previous step of measuring the magnetic field to be detected Hm. This is because, even in the no-load state where the magnetic field to be detected Hm is not applied, the difference between the resistance value R1 of the MR element 5A and the resistance value R2 of the MR element 5B does not become 0.

In the first embodiment, the direction of the anisotropic field Hk1 corresponds to the direction of the anisotropic field Hk2, and the MR elements 5A and 5B are in such a relationship that the MR elements 5A and 5B come coincident with each other when performing a rotational operation around a central axis CL of rotation parallel to stack surfaces of the stacked structure or performing both of the rotational operation and a parallel shift operation, the central axis CL being located in parallel to the anisotropic fields Hk1 and Hk2. Thus, the angle α1 is substantially equal to the angle α2. Further, because the MR elements 5A and 5B are collectively formed, the MR elements 5A and 5B substantially have performance equal to each other. Therefore, the offset output becomes extremely small.

Further, in the current sensor, the electric potential V1 detected at the third connection point P13, and the electric potential V2 detected at the fourth connection point P14 are supplied to the differential detector AMP, and the compensation current Id is outputted so that the difference (potential difference V0) between the electric potential V1 and the electric potential V2 becomes zero. The compensation current Id from the differential detector AMP is supplied to the compensation current line C, and flows in the predetermined direction in the vicinity of the MR elements 5A and 5B so that the compensation magnetic field Hd in the direction opposite from that of the induced magnetic field Hm is generated. The compensation magnetic field Hd acts so as to cancel the error caused by the variation of the connection resistance in the circuit, the variation of the characteristics between the MR elements 5A and 5B, the bias of the temperature distribution, a disturbance magnetic field from the external, or the like. As a result, the magnitude of the compensation magnetic field Hd approaches the magnitude proportional to only the induced magnetic field Hm. Therefore, in the compensation current detection means S, the output voltage Vout is measured, and the compensation current Id is calculated from the relationship between the output voltage Vout and the known resistor RL. Thereby the induced magnetic field Hm is accurately acquired and consequently the magnitude of the current to be detected Im may be presumed with high precision.

As described above, according to the current sensor of the first embodiment, because each of the element patterns 50A1, 50A2, 50B1, and 50B2 of the MR elements 5A and 5B is disposed in the same layer level which is different from the layer level where the straight line section 41 of the conductor 40 extends, the distance between each of the element patterns 50A1, 50A2, 50B1, and 50B2 and the straight line section 41 may be made all equal to each other. Thus, the induced magnetic fields Hm of equal magnitude may be applied to each of the element patterns 50A1, 50A2, 50B1, and 50B2, and thereby the resistance values R1 and R2 of the MR elements 5A and 5B change more accurately, and the induced magnetic field Hm and the current to be detected Im may be measured with high precision. Especially, if the free layers 53A and 53B in which the directions of the magnetizations J53A and J53B are changed according to the induced magnetic field Hm are located in the height level corresponding to the straight line section 41, respectively, the changes of the resistance values R1 and R2 of the MR elements 5A and 5B become more precise and the measurement with the higher precision is possible.

Especially, the MR elements 5A and 5B are provided on the element substrates 11 and 21, respectively, and the element substrates 11 and 21 are fixed on the planes 101S and 102S of the integrated substrates 101 and 102 having the planes 101K and 102K as the reference planes, respectively. Thus, the current sensor is disposed so that the planes 101K and 102K become parallel to the straight line section 41, and thereby the distance between each of the element patterns 50A1, 50A2, 50B1, and 50B2 and the straight line section 41 may be easily set to be equal to each other.

Also, because the MR elements 5A and 5B are in such a relationship that the MR elements 5A and 5B come coincident with each other when performing a rotational operation around a central axis of rotation parallel to stack surfaces of the stacked structure or performing both of the rotational operation and a parallel shift operation, the central axis CL being located in parallel to the stack surface, in the initial state, the relative angle α1 between the magnetization direction J53A and the magnetization direction J51A, and the relative angle α2 between the magnetization direction J53B and the magnetization J51B become equal to each other. Further, according to the induced magnetic field Hm, the resistance value R1 of the MR element 5A and the resistance value R2 of the MR element 5B show the changes in the directions opposite to each other. As a result, the offset output caused by the error of the relative angle α1 and the relative angle α2 may be suppressed, and thereby the induced magnetic field Hm may be measured with higher precision.

Further, because the coil 30 is provided, even in the case that the magnetizations J53A and J53B of the free layers 53A and 53B are disturbed by the unnecessary magnetic field (disturbance magnetic field) from the external, the refresh magnetic field Href may be applied to the MR elements 5A and 5B in the direction of the anisotropic fields Hk1 and Hk2. Thus, the free layers 53A and 53B are saturated, and the directions of the magnetizations J53A and J53B may be temporarily aligned in the certain direction (the direction of the synthetic magnetic fields H1 and H2). Further, because the refresh magnetic field Href is applied, the directions of the anisotropic fields Hk1 and Hk2 are stabled. Therefore, when the magnetic field Hm is detected after the refresh magnetic field Href is applied to the MR elements 5A and 5B, even if the current to be detected Im is weak, the current to be detected Im may be measured with high precision and stability.

Also, in the first embodiment, all the plurality of MR elements 5 collectively formed on the same substrate S are collectively regulated so that the magnetization direction easy axis Hk of the free layer 53 and the magnetization direction J51 of the pinned layer 51 are different to each other. After that, the first and the second modules 10 and 20 cut away from the substrate S are fixed so that the MR elements 5A and 5B are in such a relationship that the MR elements 5A and 5B come coincident with each other when performing a rotational operation around the central axis CL of rotation parallel to stack surfaces of the stacked structure or performing both of the rotational operation and a parallel shift operation. Thereby, the error of the angle α1 and the angle α2, and the error of performance including the sensitivity of the MR elements 5A and 5B may be suppressed to an extremely low level.

Further, the compensation line C to which the compensation current Id is supplied on the basis of the potential difference V0 between the electric potential V1 detected at the third connection point P13 and the electric potential V2 detected at the fourth connection point P14 (difference of the voltage drops respectively generated in the MR elements 5A and 5B) is provided, and, by the thin film coils 61A and 61B, the compensation magnetic field Hd in the direction opposite from that of the induced magnetic field Hm is imparted to the MR elements 5A and 5B, respectively. Thereby, the change of the output voltage Vout caused by the variation of the characteristics between the MR elements 5A and 5B, the variation of the connection resistance in the circuit, the temperature distribution or the like may be canceled so that the induced magnetic field Hm may be detected with the higher sensitivity and the higher precision.

Second Embodiment

Next, the configuration of a current sensor in a second embodiment of the present invention will be described. The current sensor of the second embodiment has the configuration similar to that of the first embodiment, except that the configurations of the first module 10 and the second module 20 are different. Therefore, the difference from the current sensor of the first embodiment will be mainly described, and thereby the description of the other parts is appropriately omitted.

Figure 16:
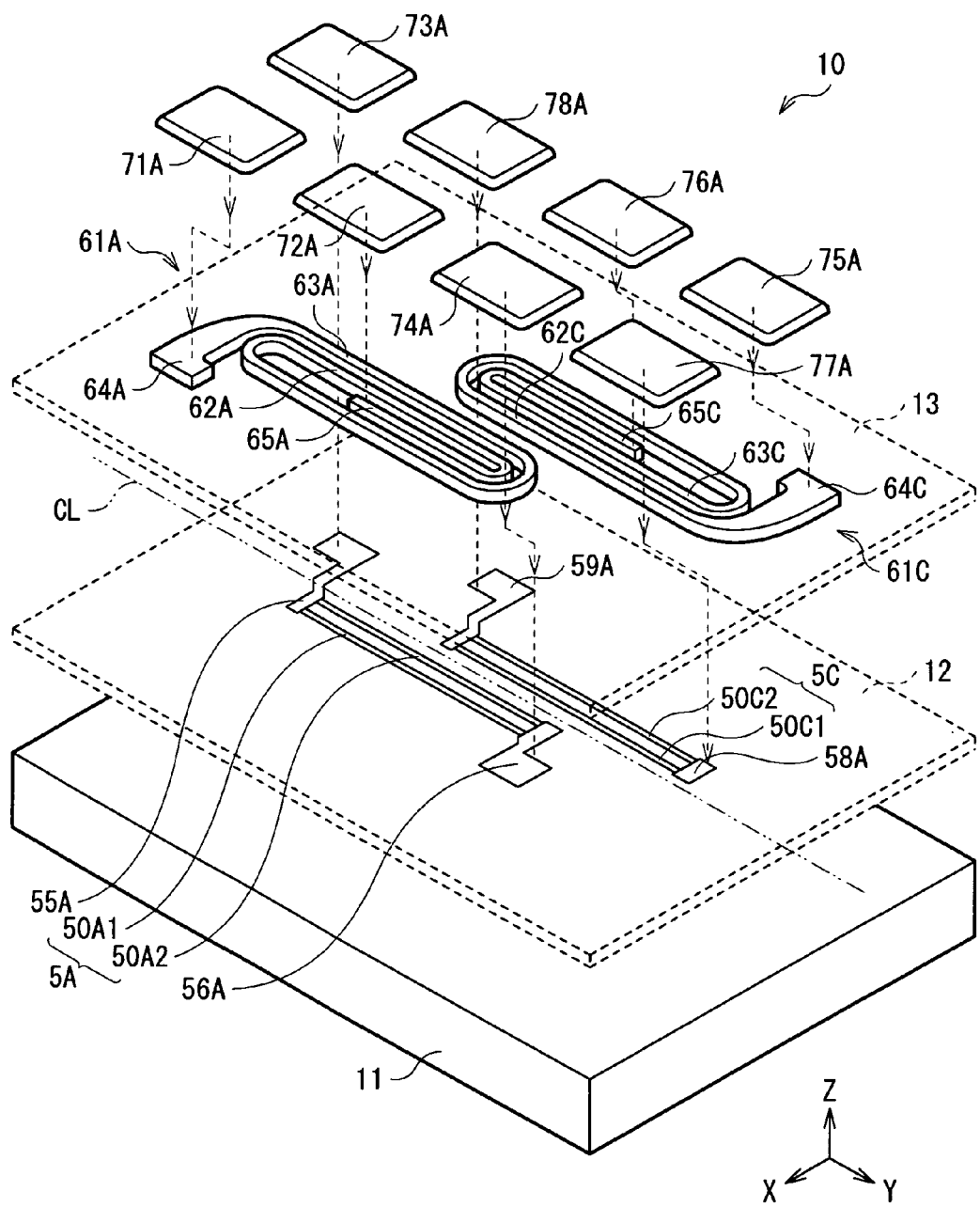
FIG. 16 is an exploded perspective view showing the configuration of the main part of the current sensor in a second embodiment of the present invention.
Figure 17:
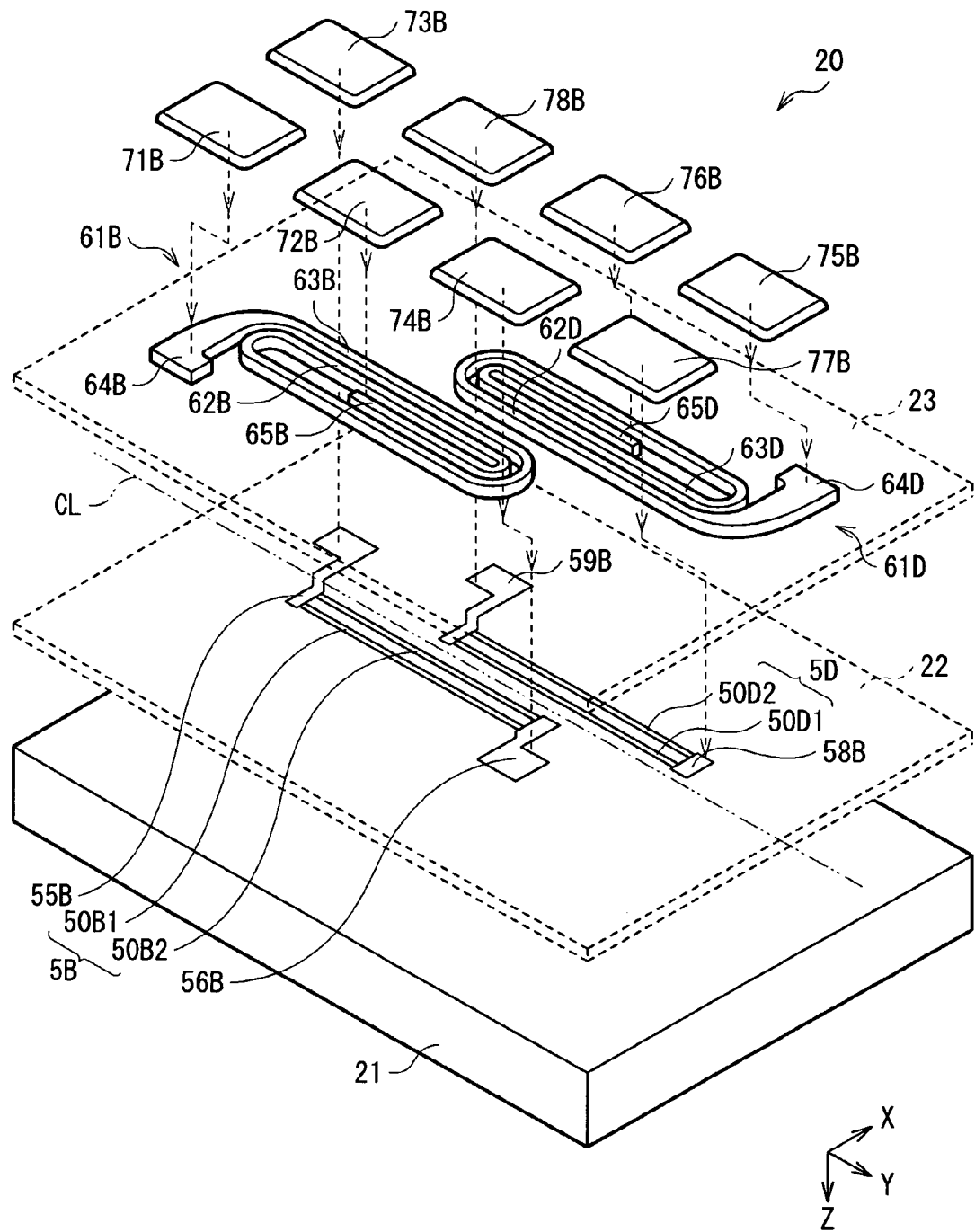
FIG. 17 is an exploded perspective view showing the configuration of another main part of the current sensor in the second embodiment of the present invention.

FIGS. 16 and 17 are outline views showing the perspective configurations of the first module 10 and the second module 20, respectively, in the current sensor of the second embodiment.

The current sensor of the first embodiment is configured by the two MR elements (MR elements 5A and 5B) and the two constant current sources (constant current sources CG1 and CG2). On the other hand, the current sensor of the second embodiment is configured by four MR elements (MR elements 5A to 5D).

As shown in FIG. 16, in the first module 10 of the second embodiment, an MR element layer 12 provided on an element substrate 11 is configured so as to include an MR element 5A and an MR element 5C. The MR element 5A has two element patterns 50A1 and 50A2, and the MR element 5C has two element patterns 50C1 and 50C2. The element patterns 50A1 and 50A2 extend in parallel to each other along an Y-axis, and are disposed so as to be located side by side along an X-axis. Also, the element patterns 50A1 and 50A2 are connected in parallel to each other by a coupling section 55A and a coupling section 56A. Similarly, the element patterns 50C1 and 50C2 extend in parallel to each other along the Y-axis, and are disposed so as to be located side by side along the X-axis. Also, the element patterns 50C1 and 50C2 are connected in parallel to each other by a coupling section 58A and a coupling section 59A.

Also, in the thin film coil layer 13, a thin film coil 61A corresponding to the MR element 5A, and a thin film coil 61C corresponding to the MR element 5C are provided so as to be wound in an X-Y plane, respectively. Specifically, the thin film coil 61A includes the wiring portions 62A and 63A extending along the Y-axis in correspondence with the element patterns 50A1 and 50A2, respectively, and the thin film coil 61C includes wiring portions 62C and 63C extending along the Y-axis in correspondence with the element patterns 50C1 and 50C2, respectively. Each of the thin film coils 61A and 61C functions as a part of the compensation current line C by the supply of the compensation current Id.

Electrode films 71A to 78A are provided on the thin film coil layer 13. Among them, the electrode films 73A, 74A, 77A, and 78A are connected to coupling sections 55A, 56A, 58A, and 59A, respectively, with contact holes (not shown in the figure) in between. An end portion 64A which is one end of the thin film coil 61A is connected to the electrode film 71A with the contact hole (not shown in the figure) in between. An end portion 65A which is the other end of the thin film coil 61A is connected to the electrode film 72A with a contact hole (not shown in the figure) in between. Further, end portions 64C and 65C of the thin film coil 61C are connected to the electrode films 75A and 76A, respectively, with the contact holes (not shown in the figure) in between. In addition, in the case that the current to be detected Im flows in the −Y direction, the compensation current Id flows from the end portion 64A to the end portion 65A through the thin film coil 61A, and flows from the end portion 65C to the end portion 64C through the thin film coil 61C.

On the other hand, in the second module 20 of the second embodiment, as shown in FIG. 17, an MR element layer 22 provided on an element substrate 21 is configured so as to include an MR element 5B and an MR element 5D. Also, on the thin film coil layer 23, a thin film coil 61B corresponding to the MR element 5B, and a thin film coil 61D corresponding to the MR element 5D are provided so as to be wound in the X-Y plane. The MR element 5B has element patterns 50B1 and 50B2 corresponding to the element patterns 50A1 and 50A2. The element patterns 50B1 and 50B2 are connected in parallel to each other by a coupling section 55B and a coupling section 56B. On the other hand, the MR element 5D has element patterns 50D1 and 50D2 corresponding to the MR elements 50C1 and 50C2. The element patterns 50D1 and 50D2 are connected in parallel to each other by a coupling section 58B and a coupling section 59B. Also, the thin film coil 61B includes the wiring portions 62B and 63B extending along the Y-axis in correspondence with the element patterns 50B1 and 50B2, respectively. The thin film coil 61D includes wiring portions 62D and 63D extending along the Y-axis in correspondence with the element patterns 50D1 and 50D2, respectively. Each of the thin film coils 61B and 61D functions as a part of the compensation current line C by the supply of the compensation current Id.

Further, electrode films 71B to 78B are provided on the thin film coil layer 23. Among them, the electrode films 73B, 74B, 77B, and 78B are connected to coupling sections 55B, 56B, 58B, and 59B, respectively, with the contact holes (not shown in the figure) in between. An end portion 64B which is one end of the thin film coil 61B is connected to the electrode film 71B with the contact hole (not shown in the figure) in between. An end portion 65B which is the other end of the thin film coil 61B is connected to the electrode film 72B with the contact hole (not shown in the figure) in between. Further, end portions 64D and 65D of the thin film coil 61D are connected to the electrode films 75D and 76D, respectively, with the contact holes (not shown in the figure) in between. In addition, in the case that the current to be detected Im flows in the −Y direction, the compensation current Id flows from the end portion 64B to the end portion 65B through the thin film coil 61B, and flows from the end portion 65D to the end portion 64D through the thin film coil 61D.

The element patterns 50A1, 50A2, 50C1, and 50C2 in the MR elements 5A and 5C of the second embodiment have configurations exactly same as those of the element patterns 50A1 and 50A2 in the MR element 5A of the first embodiment. Similarly, the element patterns 50B1, 50B2, 50D1, and 50D2 in the MR elements 5B and 5D of the second embodiment have configurations exactly same as those of the element patterns 50B1 and 50B2 in the MR element 5B of the first embodiment. That is, the MR elements 5A and 5C, and the MR elements 5B and 5D are in such a relationship that t the MR elements 5A and 5C and the MR elements 5B and 5D come coincident with each other when performing a rotational operation around the central axis CL of rotation parallel to stack surfaces of the stacked structure or performing both of the rotational operation and a parallel shift operation. By such a configuration, when the current to be detected Im flows to the conductor 40 and the induced magnetic field Hm is generated, the MR element 5A and the MR element 5C indicate behaviors similar to each other, and the MR element 5B and the MR element 5D indicate behaviors opposite from those of the MR element 5A and the MR element 5C, respectively.

Here, the element patterns 50A1, 50A2, 50C1, and 50C2 are preferably located with equal distances away to the central axis. This is because, thereby, the induced magnetic field Hm which is more homogeneous may be imparted to each of the element patterns 50A1, 50A2, 50C1, and 50C2, and the measurement with the higher precision is possible.

A method of manufacturing the current sensor of the second embodiment is almost similar to that of the first embodiment.

Specifically, first, a plurality of the MR elements are collectively formed on the surface of the substrate such as a silicon wafer. After that, the substrate is divided into (cut into) a plurality of pieces so that each piece includes two MR elements 5, in order to take out the first module 10 shown in FIG. 16 and the second module 20 shown in FIG. 17. After the obtained first module 10 and the second module 20 are adhered to the integrated substrates 101 and 102, respectively, the integrated substrate 101 with the first module 10, and the integrated substrate 102 with the second module 20 are adhered to each other with spacers 103 and 104 in between so that the MR elements 5A and 5C and the MR elements 5B and 5D are in such a relationship that the MR elements 5A and 5C and the MR elements 5B and 5D come coincident with each other when performing a rotational operation around the central axis CL of rotation parallel to stack surfaces of the stacked structure or performing both of the rotational operation and a parallel shift operation. At that time, each of the element patterns of the MR elements 5A to 5D is located in the same layer level.

Finally, other predetermined steps are taken such as providing a coil 30 (refer to FIG. 1) winding around the periphery of the integrated substrates 101 and 102 which are adhered together. Thereby, the current sensor of the second embodiment is completed.

Figure 18:
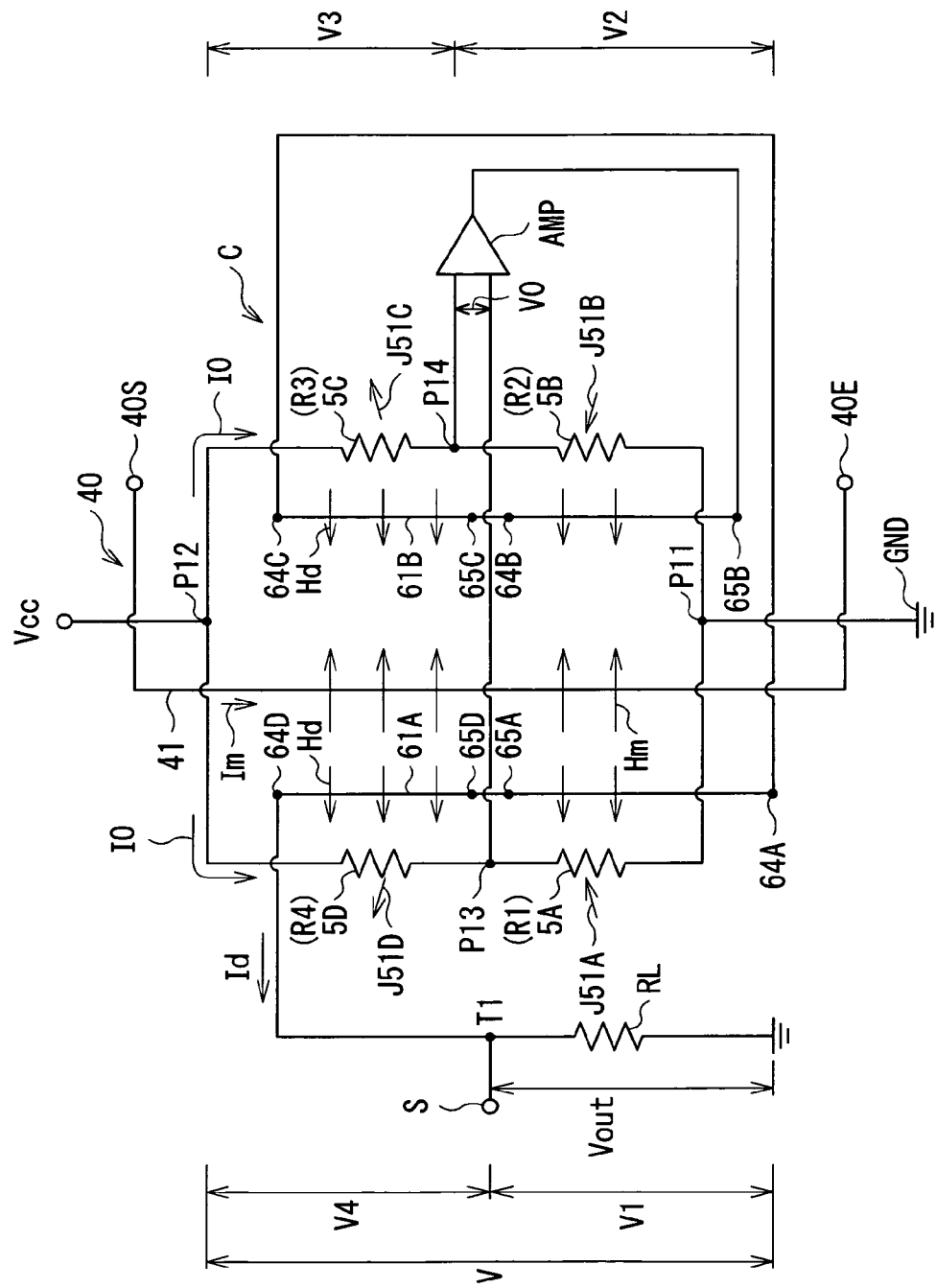
FIG. 18 is a circuit view showing the circuit configuration of the current sensor in the second embodiment.

The circuit configuration of the current sensor of the second embodiment is as shown in FIG. 18. Here, the one end of the MR element 5A and the one end of the MR element 5B are connected at the connection point P11, and the one end of the MR element 5C and the one end of the MR element 5D are connected at the second connection point P12. The other end of the MR element 5A and the other end of the MR element 5D are connected at the third connection point P13, and the other end of the MR element 5B and the other end of the MR element 5C are connected at the fourth connection point P14. Thereby, a bridge circuit is configured.

In the current sensor, according to the change of the induced magnetic field Hm, the MR elements 5C and 5D indicate behaviors exactly same as those of the MR elements 5A and 5B, respectively. In FIG. 18, when the predetermined voltage is applied between the first connection point P11 and the second connection point P12, a constant current is referred to as 10, and resistance values of the MR elements 5A to 5B are referred to as R1 to R4, respectively. In the case that the induced magnetic field Hm is not applied, a potential difference V between the second connection point P12 and the first connection point 11 may be expressed by $$V = I1 \times R4 + I1 \times R1 \quad\quad (5)$$
$$= I2 \times R3 + I2 \times R2$$
$$= I1 \times (R4 + R1)$$
$$= I2 \times (R3 + R2)$$

Also, an electric potential V1 at the third connection point P13 and an electric potential V2 at the fourth connection point P14 may be respectively expressed by $$V1 = V - V4$$
$$= V - I1 \times R4$$
$$V2 = V - V3$$
$$= V - I2 \times R3$$

Therefore, the potential difference V0 between the third connection point P13 and the fourth connection point P14 is expressed by $$V0 = V1 - V2 \quad (6)$$
$$= (V - I1 \times R4) - (V - I2 \times R3)$$
$$= I2 \times R3 - I1 \times R4$$

Here, by the equation (5), the following is satisfied.

$$V0 = \{R3/(R3 + R2)\} \times V - \{R4/(R4 + R1)\} \times V \quad (7)$$
$$= \{R3/(R3 + R2) - R4/(R4 + R1)\} \times V$$

In the bridge circuit, when the induced magnetic field Hm is applied, the amount of the resistance change may be acquired by measuring the voltage V0 between the third connection point P13 and the fourth connection point P14 indicated in the equation (7). When the induced magnetic field Hm is applied, if the resistance values R1 to R4 are supposedly increased by the amount of changes ΔR1 to ΔR4, that is, if the resistance values R1 to R4 are respectively changed as $$R1 \rightarrow R1 + \Delta R1$$
$$R2 \rightarrow R2 + \Delta R2$$
$$R3 \rightarrow R3 + \Delta R3$$
$$R4 \rightarrow R4 + \Delta R4,$$

after the magnetic field to be detected Hm is applied, by the equation (7), the following is satisfied.

$$V0 = \{(R3+\Delta R3)/(R3+\Delta R3+R2+\Delta R2)-(R4+\Delta R4)/(R4+\Delta R4+R1+\Delta R1)\} \times V \quad (8)$$

As described above, in the current sensor, the resistance values R1 and R3 of the MR elements 5A and 5C are changed in the direction opposite from that of the resistance values R2 and R4 of the MR elements 5B and 5D. Thus, the amount of change ΔR3 and the amount of change ΔR2 are canceled by each other and the amount of change ΔR4 and the amount of change ΔR1 are canceled by each other. Thereby, there is almost no increase of denominators in each term in the equation (8) between a state where the induced magnetic field Hm is applied and a state where the induced magnetic field Hm is not applied. On the other hand, the numerators in each term in the equation (8) certainly have indications opposite from those of the amount of change ΔR3 and the amount of change ΔR4, and thus, the increase and the decrease occur without canceling by each other. This is because, when the induced magnetic field Hm is applied, in the MR elements 5B and 5D, the resistance values are correspondingly changed by the amount of changes ΔR2 and ΔR4 (ΔR2 and ΔR4<0), respectively (substantially decreased). On the other hand, in the MR elements 5A and 5C, the resistance values are correspondingly changed by the amount of changes ΔR1 and ΔR3 (ΔR1 and ΔR3>0), respectively (substantially increased).

In the second embodiment, all of the element patterns 50A1, 50A2, 50B1, 50B2, 50C1, 50C2, 50D1, and 50D2 of the MR elements 5A to 5D are located in the same layer level which is different from the layer level where the straight line section 41 of the conductor 40 extends. Thus, the induced magnetic fields Hm of equal magnitude may be applied to each of the element patterns 50A1, 50A2, 50B1, 50B2, 50C1, 50C2, 50D1, and 50D2. Thereby, the MR elements 5A to 5D more accurately show the amount of changes ΔR1, ΔR2, ΔR3, and ΔR4.

Especially, the MR elements 5A to 5D are collectively formed, and have the same characteristics, that is, the followings are satisfied.

$$R = R1 = R2 = R3 = R4$$

and $$\Delta R = \Delta R1 = -\Delta R2 = \Delta R3 = -\Delta R4$$

Therefore, the equation (8) becomes $$V0 = \{(R + \Delta R)/(2R) - (R - \Delta R)/(2R)\} \times V$$
$$= (\Delta R/R) \times V$$

In this way, by using the MR elements 5A to 5D in which the relationship between the external magnetic field and the amount of the resistance changes is already known, the magnitude of the induced magnetic field Hm may be measured, and the magnitude of the current to be detected Im deriving the induced magnetic field Hm may be presumed.

Further, similarly to the first embodiment, in the current sensor, the electric potential V1 detected at the third connection point P13 and the electric potential V2 detected at the fourth connection point P14 are supplied to the differential detector AMP, and the compensation current Id which compensates the difference (the potential difference V0) to zero is outputted. The compensation current Id from the differential detector AMP is supplied to the compensation current line C and flows in the predetermined direction in the vicinity of the MR elements 5A to 5D, and thereby the compensation magnetic field Hd in the direction opposite from that of the induced magnetic field Hm is generated.

As described above, according to the current sensor of the second embodiment, all of the element patterns 50A1, 50A2, 50B1, 50B2, 50C1, 50C2, 50D1, and 50D2 of the MR elements 5A to 5D are located in the same layer level which is different from the layer level where the straight line section 41 of the conductor 40 extends. Thus, the induced magnetic field Hm, and, further, the current to be detected Im may be measured with the high precision. Especially, if the free layer is located in the height level corresponding to the straight line section 41, the changes of the resistance values R1 to R4 of the MR elements 5A to 5D become more precise and the measurement with the higher precision is possible.

Figure 19A:
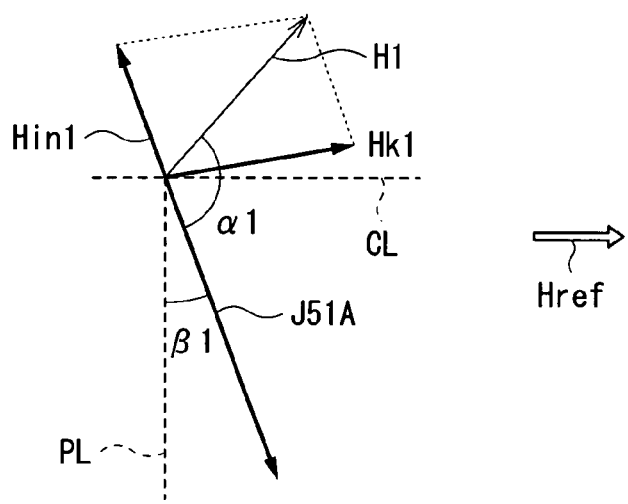
FIGS. 19A and 19B are explanatory views illustrating the relationship between a magnetization direction and the direction of a magnetic field in the main part of a current sensor as a modification of the first embodiment.
Figure 19B:
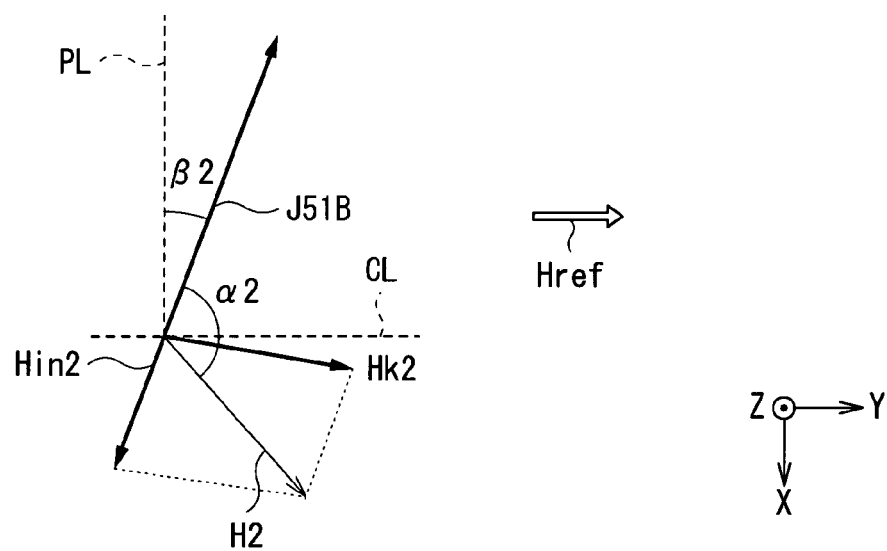

Hereinbefore, although the present invention is described with the embodiments and examples, the present invention is not limited to these and the various modifications are available. For example, in the first embodiment, the MR elements 5A and 5B are disposed so that the direction of the anisotropic fields Hk1 and Hk2 correspond to each other. However, the present invention is not limited to this. For example, as shown in FIGS. 19A and 19B, the anisotropic fields Hk1 and Hk2 may depart from the central axis CL. However, the direction of the anisotropic field Hk1 and the magnetization J51A, and the direction of the anisotropic field Hk2 and the magnetization J51B are preferably in such a relationship that the direction of the anisotropic field Hk1 and the magnetization J51A, and the direction of the anisotropic field Hk2 and the magnetization J51B come coincident with each other when performing a rotational operation around the central axis CL of rotation parallel to stack surfaces of the stacked structure or performing both of the rotational operation and a parallel shift operation. In this case, the refresh magnetic field Href is applied along the central axis CL so that the initial state may be obtained and the offset output voltage substantially can become zero. In addition, the central axis CL is the axis parallel to the plane (generally the stack surface) wholly including each of the vectors of the anisotropic fields Hk1 and Hk2, the magnetizations J51A and J51B, and the exchange coupling magnetic fields Hin1 and Hin2.

In the embodiments, the integrated substrates 101 and 102 which are the printed circuit boards having plane shapes are exemplified and explained as support members. However, the present invention is not limited to this. For example, a flexible substrate may be used as the support member. Also, in the embodiments, although the element substrates where the magnetoresistive elements are formed are disposed near the center of the integrated substrates 101 and 102 as shown in FIG. 1, the present invention is not limited to this. That is, in FIG. 1, although the central axis CL is located in the central position of the X-axis direction of the integrated substrates 101 and 102, the central axis CL may be leaned to either the side of the integrated substrate 101 or the side of the integrated substrate 102 in the X-axis direction. Also, devices other than the magnetoresistive elements may be provided on the integrated substrates 101 and 102. Further, the present invention is not limited to the dimensional ratios between the magnetoresistive elements (MR elements 5A to 5D), the compensation current lines (thin film coils 61A to 61D), the element substrates (element substrates 11 and 21), and the support members (integrated substrates 101 and 102) shown in the figures.

It should be understood by those skilled in the art that various modifications, combinations, sub-combinations and alterations may occur depending on design requirements and other factors insofar as they are within the scope of the appended claims or the equivalents thereof.

What is claimed is:

1. A current sensor disposed in a vicinity of a conductor which generates an induced magnetic field by a current to be detected which is supplied to the conductor, and detecting the current to be detected, the current sensor comprising a first magnetoresistive element and a second magnetoresistive element, each of the first and the second magnetoresistive elements having a stacked structure including:
    a pinned layer whose magnetization direction is pinned in a predetermined direction;
    a nonmagnetic intermediate layer; and
    a free layer whose magnetization direction changes according to the induced magnetic field, the free layer exhibiting an anisotropic field in a direction different from the magnetization direction of the pinned layer,
    wherein the first and the second magnetoresistive elements are configured so that the stacked structures in the first and the second magnetoresistive elements are in a same layer level, and a resistance value of the first magnetoresistive element and the resistance value of the second magnetoresistive element change in directions opposite to each other according to the induced magnetic field.

2. The current sensor according to claim 1, wherein the stacked structure of the first magnetoresistive element and the stacked structure of the second magnetoresistive element are in such a relationship that the first and the second magnetoresistive elements come coincident with each other when performing a rotational operation around a central axis of rotation parallel to stack surfaces of the stacked structure or performing both of the rotational operation and a parallel shift operation.

3. The current sensor according to claim 2, wherein extending direction of the central axis is coincident with the directions of the anisotropic fields of the free layers included in both of the first and the second magnetoresistive elements.

4. The current sensor according to claim 1, wherein both of the free layers in the first and the second magnetoresistive elements are located in the same layer level.

5. The current sensor according to claim 1 further comprising a support member supporting the first and the second magnetoresistive elements,
    wherein the support member has a reference plane facing outward, the reference plane being located in parallel to the stack surfaces of the stacked structures in the first and the second magnetoresistive elements.

6. The current sensor according to claim 1, wherein the first magnetoresistive element is formed on an element substrate and the second magnetoresistive element is formed on another element substrate.

7. The current sensor according to claim 6, wherein the element substrate on which the first magnetoresistive element is formed is provided on one of a pair of facing surfaces of a pair of support members which face each other, and another element substrate on which the second magnetoresistive element is formed is provided on the other of the facing surfaces of the pair of support members.

8. The current sensor according to claim 7, wherein each of the pair of support members has a reference plane facing outward, the reference plane being located in parallel to the stack surfaces of the stacked structures of the first and the second magnetoresistive elements.

9. The current sensor according to claim 1 further comprising:
    a first constant current source and a second constant current source supplying constant currents of equal values to the first and the second magnetoresistive elements, respectively, and
    a differential detector detecting a difference of voltage drops generated, by the constant currents, in the first and the second magnetoresistive elements, respectively.

10. The current sensor according to claim 9 further comprising a compensation current line generating a compensation magnetic field by a compensation current flowing according to the difference of the voltage drops, and applying the compensation magnetic field to the first and the second magnetoresistive elements, the compensation magnetic field directing in a direction opposite from that of the induced magnetic field applied to the first and the second magnetoresistive elements according to the current to be detected.

11. The current sensor according to claim 1 further comprising a bias magnetic field applying means for applying the bias magnetic field
    along the direction of the anisotropic field to the first and the second magnetoresistive elements.

12. A current sensor disposed in a vicinity of a conductor which generates an induced magnetic field by a current to be detected which is supplied to the conductor, and detecting the current to be detected, the current sensor comprising a first to a fourth magnetoresistive elements, each of the first to the fourth magnetoresistive elements having a stacked structure including:
    a pinned layer whose magnetization direction is pinned in a predetermined direction;
    a nonmagnetic intermediate layer; and
    a free layer whose magnetization direction changes according to the induced magnetic field, the free layer exhibiting an anisotropic field in a direction different from the magnetization direction of the pinned layer, wherein the first to the fourth magnetoresistive elements are configured so that the stacked structures of the first to the fourth magnetoresistive elements are in a same layer level, resistance values of the first and the third magnetoresistive elements change in the same direction according to the induced magnetic field, and the resistance values of the second and the fourth magnetoresistive elements change in a direction opposite from change direction of the resistance values of the first and the third magnetoresistive elements according to the induced magnetic field.

13. The current sensor according to claim 12, wherein the stacked structure of the first magnetoresistive element and the stacked structure of the third magnetoresistive element have an equivalent relationship to each other, the stacked structure of the second magnetoresistive element and the stacked structure of the fourth magnetoresistive element have the equivalent relationship to each other, and the stacked structures of the first and the third magnetoresistive elements, and the stacked structures of the second and the fourth magnetoresistive elements are in such a relationship that the first and third magnetoresistive elements, and the second and the fourth magnetoresistive elements come coincident with each other when performing a rotational operation around a central axis of rotation parallel to stack surfaces of the stacked structure or performing both of the rotational operation and a parallel shift operation.

14. The current sensor according to claim 13, wherein the first to the fourth magnetoresistive elements are disposed with equal distances away to the central axis.

15. The current sensor according to claim 14, wherein extending direction of the central axis is coincident with the directions of the anisotropic fields of the free layers included in all of the first to the fourth magnetoresistive elements.

16. The current sensor according to claim 12, wherein all of the free layers in the first to the fourth magnetoresistive elements are located in the same layer level.

17. The current sensor according to claim 12 further comprising a support member supporting the first to the fourth magnetoresistive elements, wherein the support member has a reference plane facing outward, the reference plane being located in parallel to the stack surfaces of the stacked structures in the first and the second magnetoresistive elements.

18. The current sensor according to claim 12, wherein the first and the third magnetoresistive elements are formed on a first element substrate, and the second and the fourth magnetoresistive elements are formed on a second element substrate different from the first element substrate.

19. The current sensor according to claim 18, wherein the first element substrate is provided on one of a pair of facing surfaces of a pair of support members which face each other, and the second element substrate is provided on the other of the facing surfaces of the pair of support members.

20. The current sensor according to claim 19, wherein each of the pair of support members has a reference plane facing outward, the reference plane being located in parallel to the stack surfaces of the stacked structures of the first and the second magnetoresistive elements.

21. The current sensor according to claim 12 further comprising:
a bridge circuit in which one end of the first magnetoresistive element and one end of the second magnetoresistive element are connected at a first connection point, one end of the third magnetoresistive element and one end of the fourth magnetoresistive element are connected at a second connection point, the other end of the first magnetoresistive element and the other end of the third magnetoresistive element are connected at a third connection point, and the other end of the second magnetoresistive element and the other end of the fourth magnetoresistive element are connected at a fourth connection point; and
a compensation current line generating a compensation magnetic field by a compensation current flowing according to a potential difference between the third connection point and the fourth connection point, the potential difference generated when a voltage is applied between the first connection point and the second connection point, and then the compensation magnetic field being applied to the first to the fourth magnetoresistive elements, the compensation magnetic field directing in a direction opposite from that of the induced magnetic field applied to the first to the fourth magnetoresistive elements according to the current to be detected.

22. The current sensor according to claim 12, wherein a bias magnetic field applying means for applying the bias magnetic field along the direction of the anisotropic field to the first to the fourth magnetoresistive elements.

23. The current sensor according to claim 1, wherein the magnetization direction of the pinned layer is orthogonal to the direction of a synthetic magnetic field synthesized from an exchange coupling magnetic field and the anisotropic field of the free layer, the exchange coupling magnetic field generated between the pinned layer and the free layer.

24. The current sensor according to claim 12, wherein the magnetization direction of the pinned layer is orthogonal to the direction of a synthetic magnetic field synthesized from an exchange coupling magnetic field and the anisotropic field of the free layer, the exchange coupling magnetic field generated between the pinned layer and the free layer.

25. A method of manufacturing a current sensor disposed in a vicinity of a conductor which generates an induced magnetic field by a current to be detected which is supplied to the conductor, and detecting the current to be detected, the method comprising steps of:
integrating a plurality of magnetoresistive elements on a first substrate, each of the magnetoresistive elements including a stacked structure configured by stacking in this order a first ferromagnetic layer which exhibits an anisotropic field in a predetermined direction, and whose magnetization direction changes according to the induced magnetic field, a nonmagnetic intermediate layer, and a second ferromagnetic layer having a coercive force larger than that of the first ferromagnetic layer;
collectively setting the magnetization directions of the second ferromagnetic layers in all of the plurality of magnetoresistive elements, into a direction different from that of the anisotropic field,
taking out a first and a second element substrates each including one magnetoresistive element, by dividing a substrate into a plurality of pieces; and
disposing the first and the second element substrates so that the stacked structures of the magnetoresistive elements are located in the same layer level, and a resistance value of the magnetoresistive element on the first element substrate and the resistance value of the magnetoresistive element on the second element substrate show changes in directions opposite to each other according to the induced magnetic field.

26. The method of manufacturing the current sensor according to claim 25, wherein the first and the second element substrates are disposed so that the stacked structure of the first element substrate and the stacked structure of the second element substrate are in such a relationship that the first and the second magnetoresistive elements come coincident with each other when performing a rotational operation around a central axis or rotation parallel to stack surfaces of the stacked structure or performing both of the rotational operation and a parallel shift operation.

27. A method of manufacturing a current sensor disposed in a vicinity of a conductor which generates an induced magnetic field by a current to be detected which is supplied to the conductor, and detecting the current to be detected, the method comprising steps of:

integrating a plurality of magnetoresistive elements on a first substrate, each of the magnetoresistive elements including a stacked structure configured by stacking in this order a first ferromagnetic layer which exhibits an anisotropic field in a predetermined direction, and whose magnetization direction changes according to the induced magnetic field, a nonmagnetic intermediate layer, and a second ferromagnetic layer having a coercive force larger than that of the first ferromagnetic layer;

collectively setting the magnetization directions of the second ferromagnetic layers in all of the plurality of magnetoresistive elements, in a direction different from that of the anisotropic fields, forming a first and a second element modules each including two magnetoresistive elements, by dividing a substrate into a plurality of pieces; and disposing the first and the second element modules so that the stacked structures of the four magnetoresistive elements in the first and second element modules are located in the same layer level, and resistance values of the magnetoresistive elements on the first element module and the resistance values of the magnetoresistive elements on the second element module change in directions opposite to each other according to the induced magnetic field.

28. The method of manufacturing the current sensor according to claim 27, wherein the first and the second element modules are disposed so that the stacked structure of the first element module and the stacked structure of the second element module are in such a relationship that the first and the second magnetoresistive elements come coincident with each other when performing a rotational operation around a central axis of rotation parallel to stack surfaces of the stacked structure or performing both of the rotational operation and a parallel shift operation.

* * * * *